(12) United States Patent
Thompson et al.

(10) Patent No.: US 12,317,738 B2
(45) Date of Patent: May 27, 2025

(54) SYMMETRIC CHARGE TRANSFER COMPOUNDS FOR ORGANIC PHOTOVOLTAICS

(71) Applicant: The University of Southern California, Los Angeles, CA (US)

(72) Inventors: Mark E. Thompson, Anaheim, CA (US); Austin Mencke, Santa Monica, CA (US)

(73) Assignee: The University of Southern California, Los Angeles, CA (US)

( * ) Notice: Subject to any disclaimer, the term of this patent is extended or adjusted under 35 U.S.C. 154(b) by 0 days.

(21) Appl. No.: 17/386,183

(22) Filed: Jul. 27, 2021

(65) Prior Publication Data
US 2022/0109106 A1    Apr. 7, 2022

Related U.S. Application Data

(60) Provisional application No. 63/058,591, filed on Jul. 30, 2020.

(51) Int. Cl.
*H10K 85/30* (2023.01)
*C07F 1/08* (2006.01)
*C07F 3/06* (2006.01)
*C07F 5/02* (2006.01)
*C07F 7/22* (2006.01)
(Continued)

(52) U.S. Cl.
CPC .............. *H10K 85/322* (2023.02); *C07F 1/08* (2013.01); *C07F 3/06* (2013.01); *C07F 5/022* (2013.01); *C07F 7/2284* (2013.01); *C07F 15/0026* (2013.01); *C07F 15/008* (2013.01);
(Continued)

(58) Field of Classification Search
CPC ..... H01L 51/008; H01L 51/42; H01L 51/424; H01L 51/0071; H01L 51/0084; H01L 51/0088; H01L 51/0091; H01L 51/0092; H01L 51/4253; C07F 1/08; C07F 3/06; C07F 5/022; C07F 7/2284; C07F 15/0026; C07F 15/008; C07F 1/005; C07F 3/003; C09K 11/06; C09K 2211/1018;
(Continued)

(56) References Cited

U.S. PATENT DOCUMENTS

2011/0226992 A1    9/2011 Takeshima
2015/0303378 A1*   10/2015 Han .................... H10K 39/32
                                              548/405
(Continued)

FOREIGN PATENT DOCUMENTS

CN    109134525 A  *  1/2019  ............ C07F 7/0816
JP    2007169541        7/2007
(Continued)

OTHER PUBLICATIONS

Weiwei Li "Benzothiadiazole-Based Linear and Star Molecules: Design, Synthesis, and Their Application in Bulk Heterojunction Organic Solar Cells" Chem. Mater. 2009, 21, 5327-5334 (Year: 2009).*

(Continued)

*Primary Examiner* — Michael Y Sun
(74) *Attorney, Agent, or Firm* — Riverside Law LLP

(57) ABSTRACT

The present disclosure is related to organic acceptor-donor-acceptor compounds as non-fullerene acceptors for use in organic photovoltaics.

8 Claims, 29 Drawing Sheets

(51) Int. Cl.
  *C07F 15/00* (2006.01)
  *C09K 11/06* (2006.01)
  *H10K 30/00* (2023.01)
(52) U.S. Cl.
  CPC ...... *C09K 11/06* (2013.01); *C09K 2211/1018* (2013.01); *H10K 30/00* (2023.02)
(58) Field of Classification Search
  CPC ........ C09K 2211/185; C09K 2211/188; Y02E 10/549; C07D 401/14
  See application file for complete search history.

(56) References Cited

U.S. PATENT DOCUMENTS

| | | |
|---|---|---|
| 2017/0349822 A1 | 12/2017 | Lee |
| 2020/0131202 A1* | 4/2020 | Obana ................. H10K 85/6576 |

FOREIGN PATENT DOCUMENTS

| | | | | |
|---|---|---|---|---|
| JP | 2013168424 A | * | 8/2013 | ......... H01L 23/5389 |
| WO | 2020005172 | | 1/2020 | |

OTHER PUBLICATIONS

Tahsin Kilicoglu "Electrical and photovoltaic properties of an organic-inorganic heterojunction based on a BODIPY dye" Microelectronic Engineering 88 (2011) 150-154 (Year: 2011).*

Yu-Tang Hsiao "Haptacyclic Carbazole-Based Ladder-Type Nonfullerene Acceptor with Side-Chain Optimization for Efficient Organic Photovoltaics" ACS Appl. Mater. Interfaces 2017, 9, 42035-42042 (Year: 2017).*

Vellaiappillai Tamilavan "Linkage position influences of anthracene and tricyanovinyl groups on the opto-electrical and photovoltaic properties of anthracenebased organic small molecules" Tetrahedron 70 (2014) 1176-1186 (Year: 2014).*

Youming Zhang "D-A-Ar-type small molecules with enlarged p-system of phenanthrene at terminal for high-performance solution processed organic solar cells" Organic Electronics 15 (2014) 1173-1183 (Year: 2014).*

Sompit Wanwong "Improved Performance of Ternary Solar Cells by Using BODIPY Triads" Materials 2020, 13, 2723 (Year: 2020).*

Yongsheng Chen "High Performance Photovoltaic Applications Using Solution-Processed Small Molecules" Accounts of Chemical Research ' 2645-2655 ' 2013 vol. 46, No. 11 (Year: 2013).*

Cui et al., Natl. Sci. Rev. 2020, 7:1239-1246.

Li et al., Phys. Chem. Chem. Phys., 2017, 19:3440-58.

Chen and Zhang, J. Mater. Chem. C. 2017, 5:1275-302.

How Donor-Bridge-Acceptor Energetics Influence Electron Tunneling Dynamics and Their Distance Dependences. O. S. Wenger, Accounts of Chemical Research, 2011. 44, 25-35, DOI: 10.1021/ar100092v.

Supramolecularly Assisted Modulation of Optical Properties of Bodipy-Benzimidazole Conjugates. S. S. Thakare, G. Chakraborty, P. Krishnakumar, A. K. Ray, D. K. Maity, H. Pal, and N. Sekar, Journal of Physical Chemistry B, 2016. 120, 11266-11278, DOI: 10.1021/acs.jpcb.6b08429.

A Solvent Depend on Ratiometric Fluorescent Probe for Hypochlorous Acid and Its Application in Living Cells. Jin Kang, Fangjun Huo, Yongkang Yue, Ying Wen, Jianbin Chao, Yongbin Zhang, and Caixia Yin, Dyes and Pigments, 2017. 136, 852-858, DOI: 10.1016/j.dyepig.2016.09.048.

Visual and Colorimetric Detection of Cyanide Anion Based on a "Turn-Off" Daylight Fluorescent Molecule. Lijuan Jiao, Mingming Liu, Min Zhang, Changjiang Yu, Zhaoyun Wang, and Erhong Hao, Chemistry Letters, 2011. 40, 623-625, DOI: 10.1246/cl.2011.623.

Veldman, et al., The Energy of Charge-Transfer States in Electron Donor—Acceptor Blends: Insight into the Energy Losses in Organic Solar Cells Adv. Funct. Mater. 2009, 19, 1-10.

Chen, Yongsheng, Xiangjian Wan, and Guankui Long. "High performance photovoltaic applications using solution-processed small molecules." Accounts of chemical research 46.11 (2013): 2645-2655.

\* cited by examiner

200 Multi-junction/Tandem Organic Photovoltaic Cell

| 202 Anode | 208 Intermediate Layer | 206A Active Region/Layer | 212 Intermediate Layer | 206B Active Region/Laer | 210 Intermediate Layer | 204 Cathode |

Figure 2

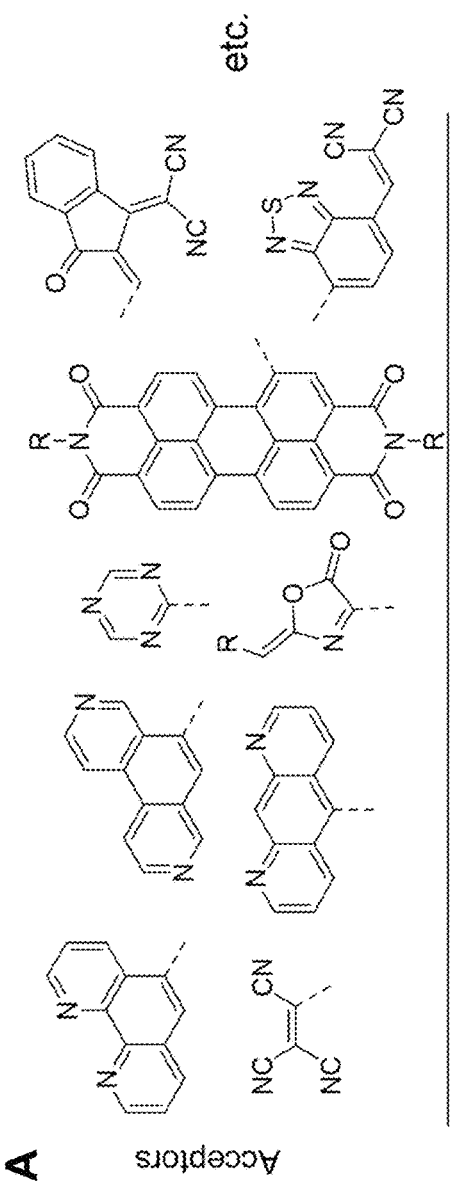
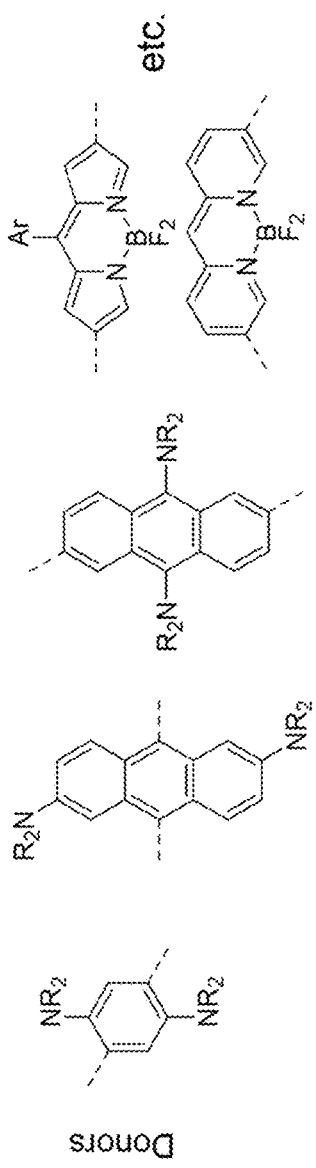
FIG. 4A
FIG. 4B
Figure 4

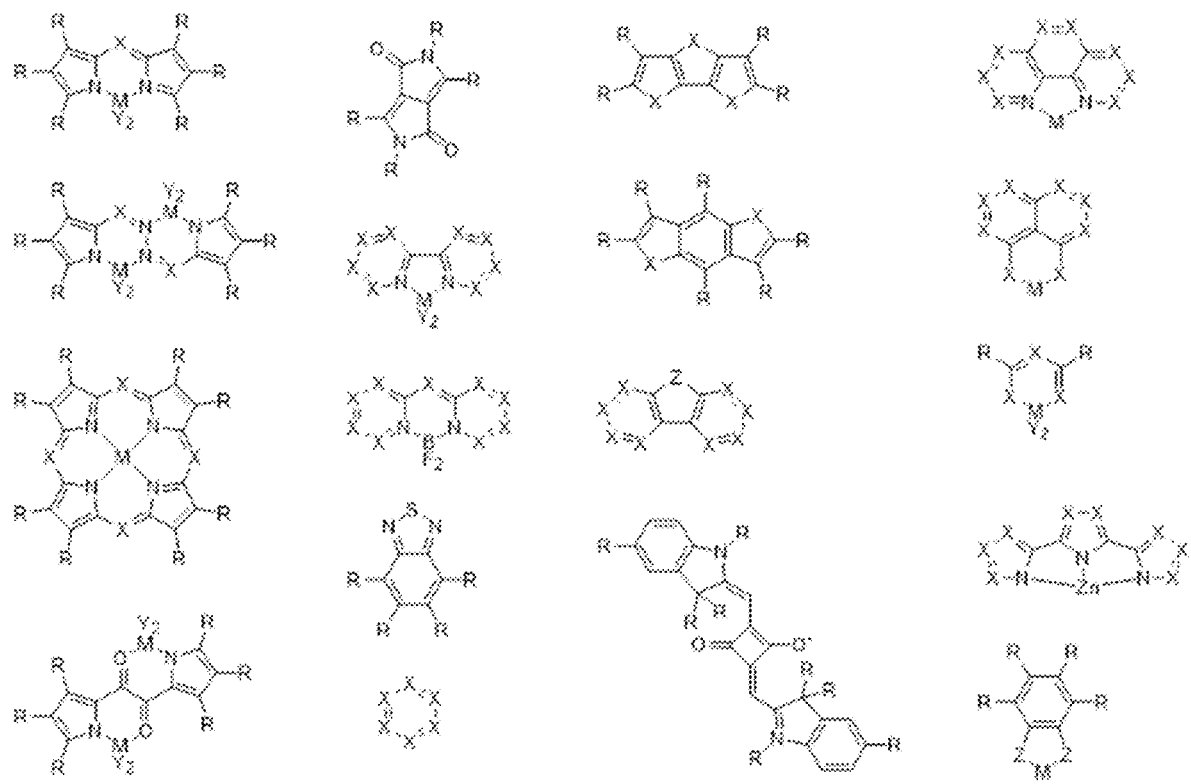

X = CR, SiR, N, P
Z = CR₂, NR, O, S
R = H, alkyl, alkenyl, alkinyl, aryl, heteroaryl, amine, amide, sulfonates, halides, alkoxide, hydroxide, benzoyl, alkylthio, CO₂H pseudohalide, alkylenedioxy, alkylenedithio, alkyleneoxythio, CO₂H, pi-bridge (see definitions elsewhere), donor (see definitions elsewhere), acceptor (see definitions elsewhere), vinyl, keto, carboxylic acid
Note: two adjacent R groups can be part of a fused aromatic or heteroaromatic ring system
Y = halide, pseudohalide, aryl, alkyl, alkenyl, alkinyl, alkoxide, hydroxide,
M = trivalent atom, such as B, Al or other metal ion
  tetravalent atom, such as C, Si, Ge, Ti, Zr or other metal ion
  divalent atom, such as Zn, Cd, Ca or other metal ion
  monovalent atom, such as Cu, Ag or other metal ion
n = 0-5

The structures here show two Y groups. The number of Y groups may vary to achieve an overall neutral charge on the molecule. Otherwise the complex may be cationic or anionic depending on the chromophoric ligand and the valence of the metal ion.

Acceptors, donors, acceptor-π bridge, and donor-π bridge moieties are present in symetric pairs in the molecule. The number of symetrical pairs can number between 1-3.

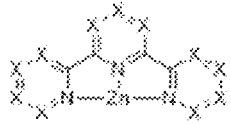

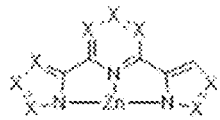

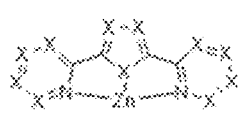

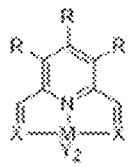

Figure 7

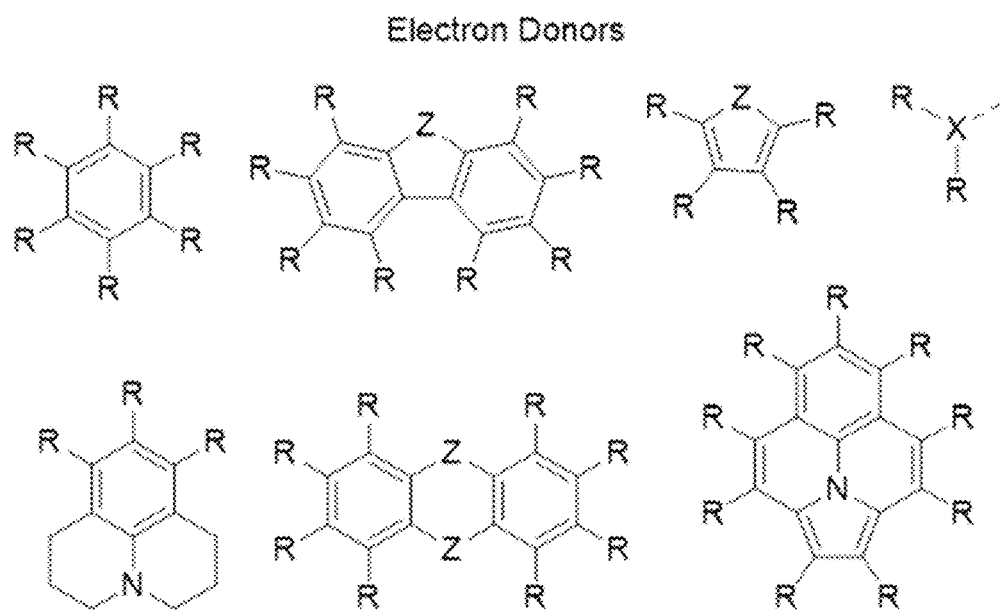

X = CR, SiR, N, P
Z = CR₂, NR, O, S
R = H, alkyl, alkenyl, alkinyl, aryl, heteroaryl, amine, amide, vinyl, keto, sulfonates, halides, alkoxide, hydroxyide, benzoyl, alkylthio, carboxylic acid pseudohalide, alkylenedioxy, alkylenedithio, alkyleneoxythio, $CO_2H$, pi-bridge (see definitions elsewhere), core (see definitions elsewhere).
NOTE: two adjacent R groups can be part of a fused aromatic or heteroaromatic ring system

Figure 8

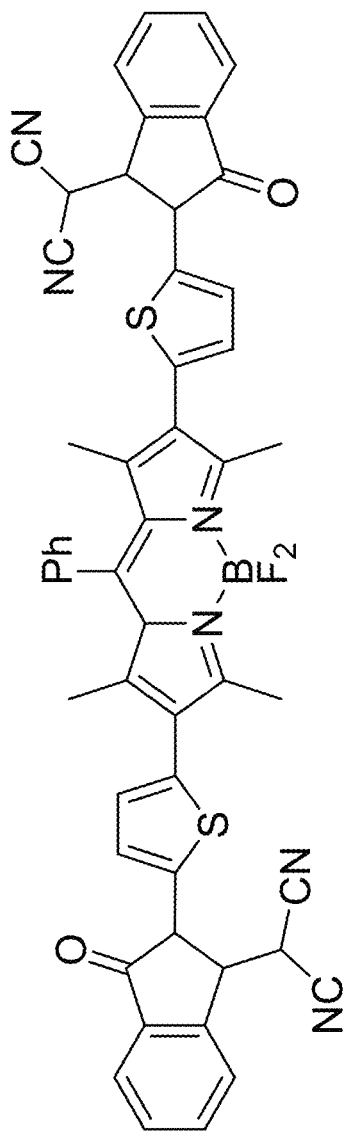
FIG. 10A
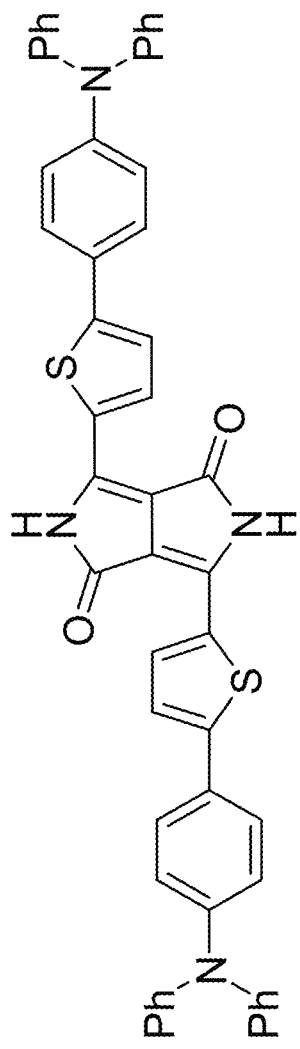
FIG. 10B
Figure 10

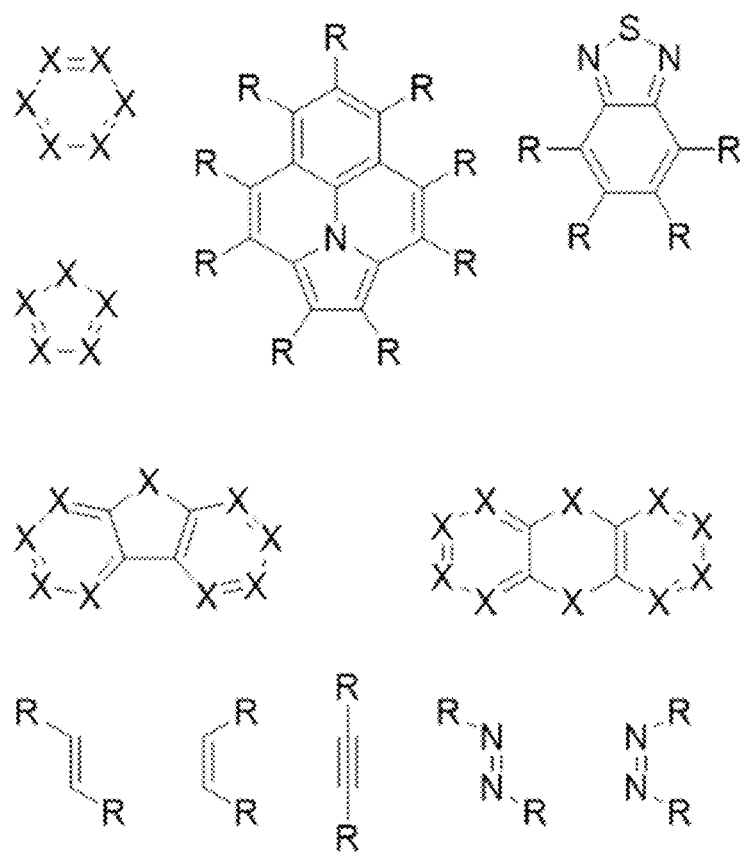

Pi Bridges

X = CR, SiR, N, P
Z = CR$_2$, NR, O, S
R = H, alkyl, alkenyl, alkinyl, aryl, heteroaryl, aryl extension, heteroaryl extention, amine, amide, vinyl, keto, carboxylic acid, sulfonates, halides, alkoxide, hydroxyide, benzoyl, alkylthio, CO$_2$H pseudohalide, alkylenedioxy, alkylenedithio, alkyleneoxythio, CO$_2$H, pi-bridge (see definitions elsewhere), donor (see definitions elsewhere), acceptor (see definitions elsewhere), core (see definitions elsewhere).

Figure 12

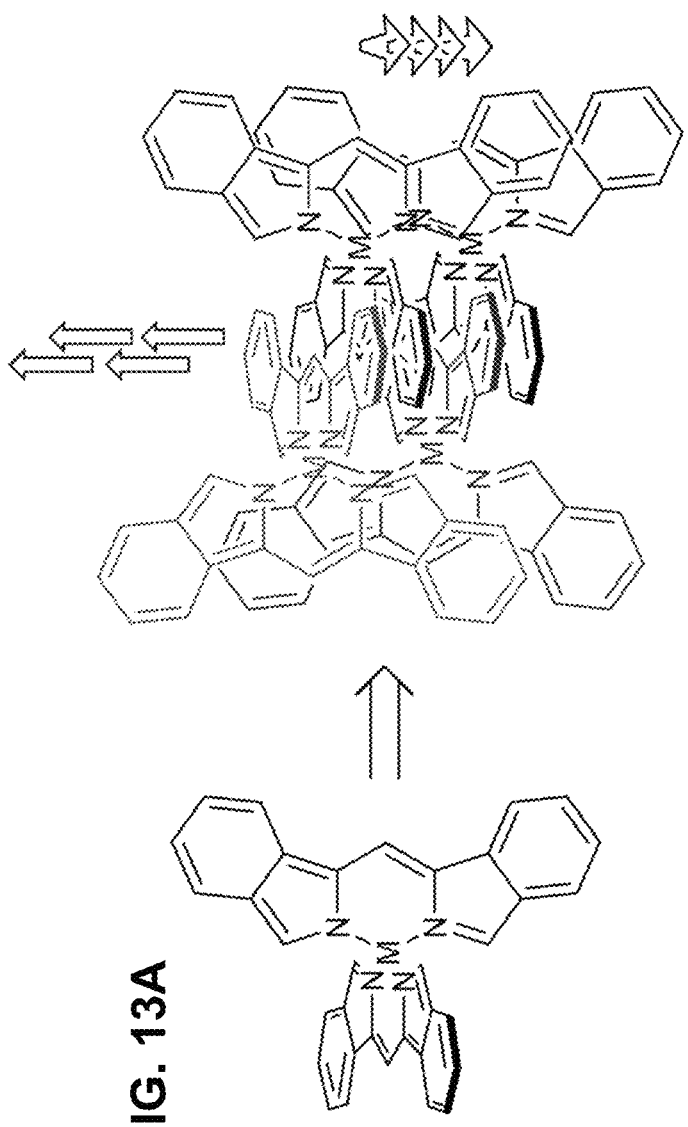
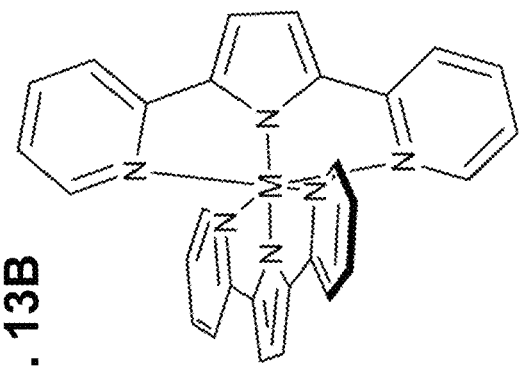
FIG. 13A  FIG. 13B
Figure 13

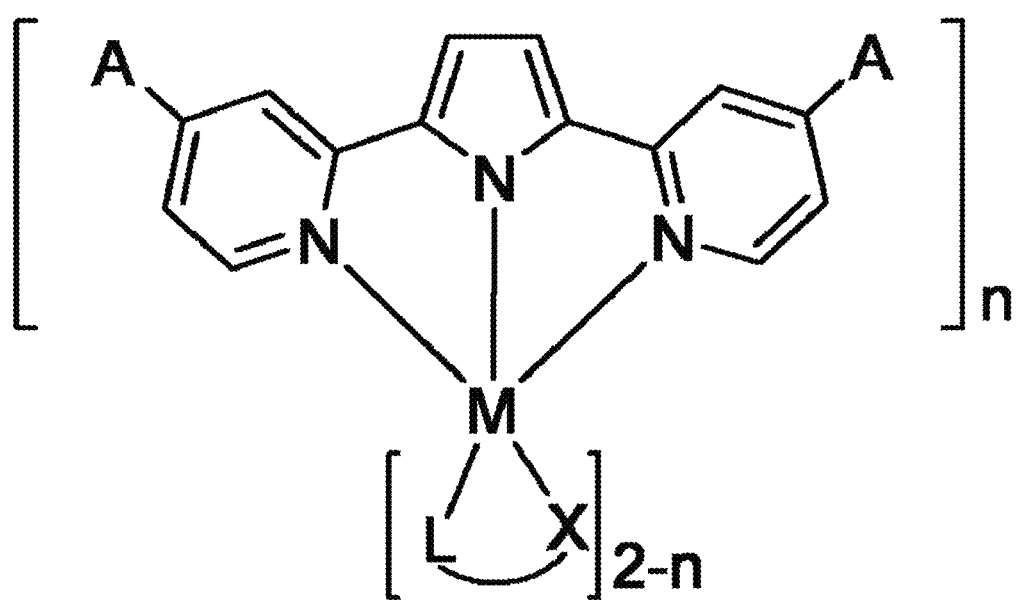
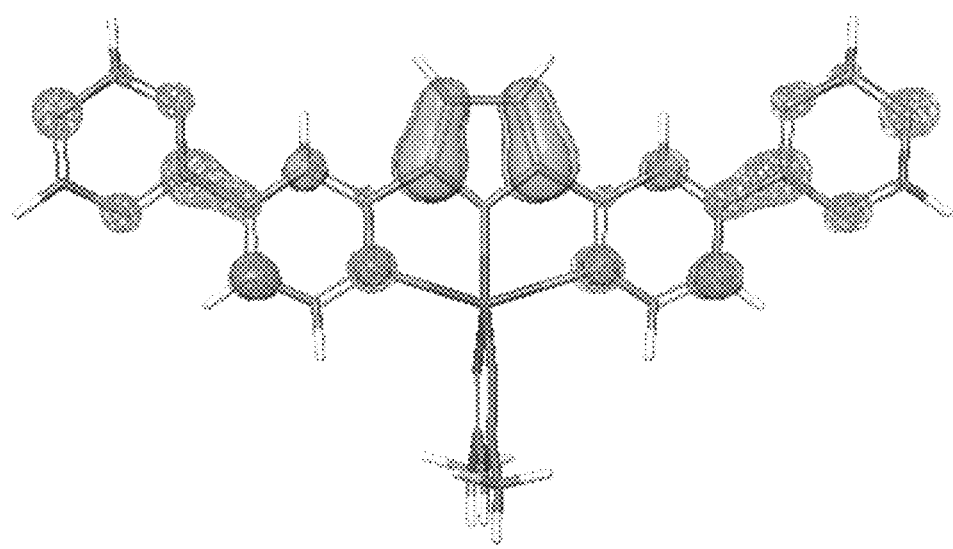
Figure 14

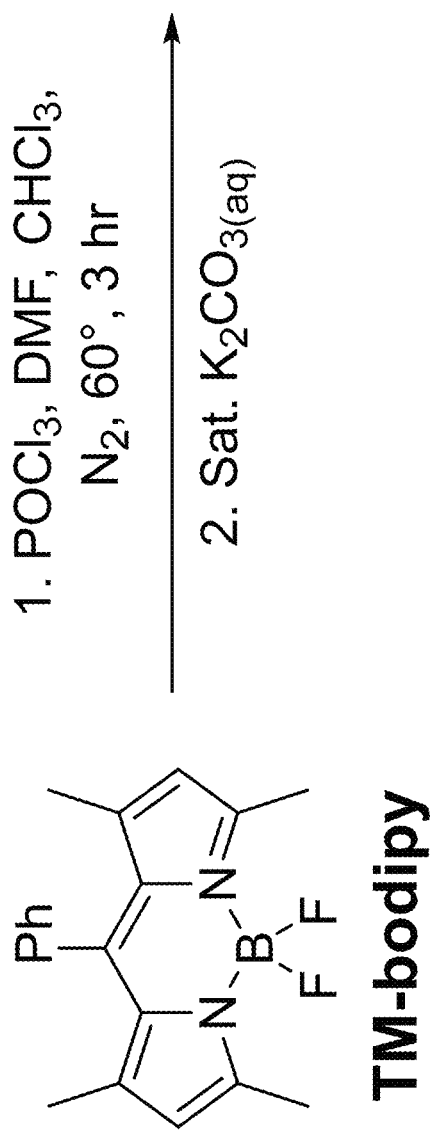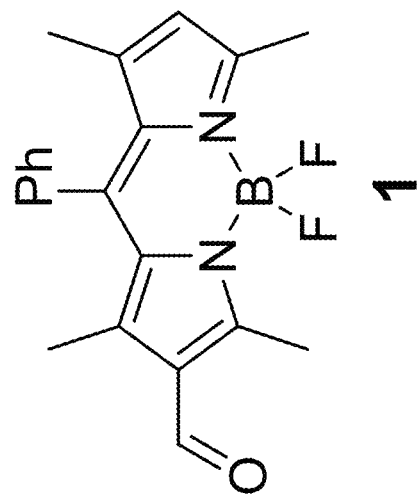
Figure 16

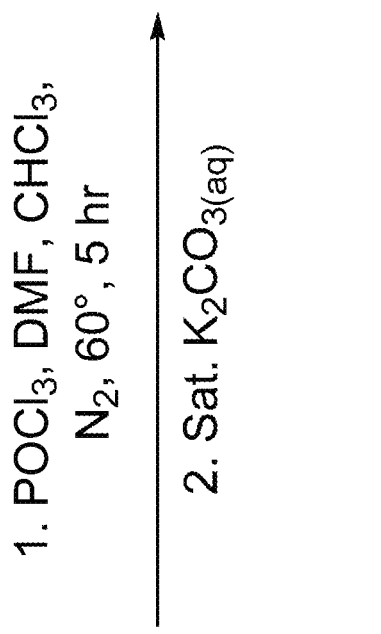
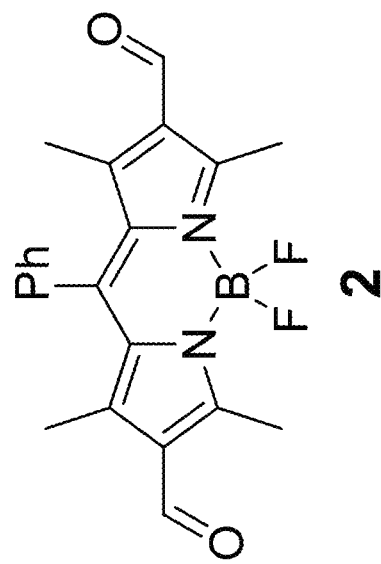
1. POCl₃, DMF, CHCl₃, N₂, 60°, 5 hr
2. Sat. K₂CO₃(aq)
Figure 17

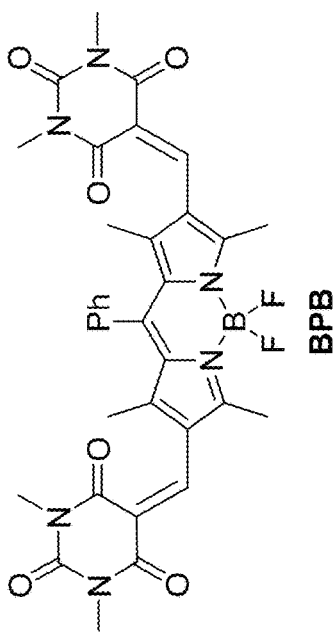
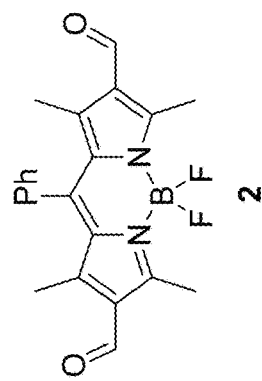
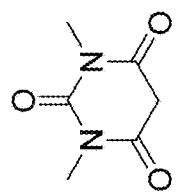
Figure 20

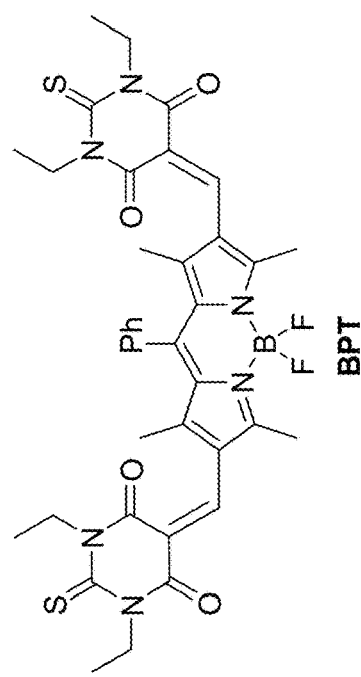
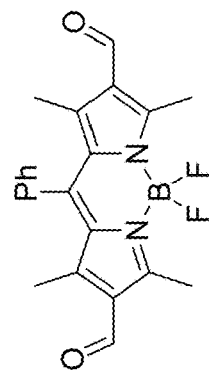
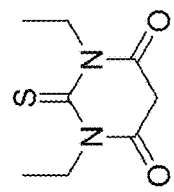
Figure 22

| Solvent | T (K) | $\lambda_{Abs}$ (nm) | $\lambda_{Em}$ (nm) | Em (eV) | $\Phi_{PL}$ | $\tau$ (ns) | $k_r$ ($10^8$ s$^{-1}$) | $k_{nr}$ ($10^8$ s$^{-1}$) |
|---|---|---|---|---|---|---|---|---|
| BPM | 298 | 507 | 516 | 2.40 | 53% | 2.80 | 1.05 | 0.32 |
| | 77 | -- | 510 | 2.43 | -- | 3.18 | 1.05 | 0.37 |
| BPB | 298 | 558 | 589 | 2.10 | 24% | 1.23 | 1.94 | 6.19 |
| | 77 | -- | 575 | 2.15 | -- | 2.83 | 1.94 | 1.59 |
| BPT | 298 | -- | 613 | 2.10 | 8.3% | 1.22 | 0.68 | 7.52 |
| | 77 | -- | 596 | 2.15 | -- | 5.24 | 0.68 | 1.23 |

Figure 28

SYMMETRIC CHARGE TRANSFER COMPOUNDS FOR ORGANIC PHOTOVOLTAICS

CROSS-REFERENCE TO RELATED APPLICATIONS

The present application claims priority to U.S. Provisional Application No. 63/058,591, filed Jul. 30, 2020, which is incorporated by reference herein in its entirety.

FIELD

The present invention relates to compounds for use as emitters, and devices, such as organic light emitting diodes, including the same.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

BACKGROUND

Optoelectronic devices rely on the optical and electronic properties of materials to either produce or detect electromagnetic radiation electronically or to generate electricity from ambient electromagnetic radiation More recent efforts have focused on the use of organic photovoltaic (OPV) cells to achieve acceptable photovoltaic conversion efficiencies with economical production costs. OPVs offer a low-cost, light-weight, and mechanically flexible route to solar energy conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers or sub-cells.

The most efficient OPVs reported to date are bulk-heterojunction (BHJ) or planar mixed heterojunctions, comprised of a mixed donor/acceptor region between pure donor and acceptor layers. The record OPV efficiency in a single junction cell is 17% (Cui et al., Natl. Sci. Rev. 2019, 0:1-8) which involves the use of polymeric donor and a non-fullerene molecular acceptor in a BHJ structure. Efficiencies of 14% have also been reported for BHJ OPVs with molecular donors and non-fullerene molecular acceptors (Zhou et al., Nat. Commun 2017, 19:3440-58).

Before considering the aspects of the reported non-fullerene acceptors that have made them superior acceptors in OPVs, it is instructive to consider what properties made fullerenes the acceptor of choice in OPVs for over ten years. A number of properties of fullerenes were cited as being the reason for their high performance as acceptors in OPVs. These include: 1) fullerene thin films have strong absorption bands in the visible part of the solar spectrum, 2) fullerenes are reversibly reduced and have very low reorganization energies for electron transfer, 3) fullerene dipole moments are low, leading to a reduced tendency for charge trapping, 4) fullerene π-systems overlap the π-systems of multiple adjacent molecules in 3-D, allowing for close electronic interactions with its neighbors in all directions. These characteristics combine to give high carrier conductivities and low fill factors. When paired with a well-matched donor, the fullerene/donor system can give high oen-circuit voltages ($V_{OC}$) and short-circuit currents ($J_{SC}$), and thus high power conversion efficiency (PCE).

A large number of different structures have been investigated as non-fullerene molecular acceptors, (Li et al., Phys. Chem. Chem. Phys., 2017, 19:3440-58; Chen and Zhang, J. Mater. Chem. C. 2017, 5:1275-302) but the best performing molecular acceptors to date consist of electronically coupled, electron donor (D) and acceptor (A) groups. Generally, the molecule has a linear electron donor chromophoric core flanked at both sides with electron accepting endcaps to form an A-D-A structure. Representative structures are shown in FIG. 3. Donor-acceptor structures like these were developed in polymer systems to red-shift the absorption through D/A interactions. It is thought that this A-D-A structure is important in the design of non-fullerene acceptors as it leads to intense red/NIR absorbance and formation of a charge transfer excited state on optical excitation. Similar to fullerenes, the extended π-system and high degree of conjugation in the A-D-A compounds minimize structural distortion in both the excited state and on reduction. The A-D-A acceptors generally have a center of symmetry, giving them low or no dipole moment. Lastly, the placement of the accepting groups in the A-D-A structure ensures that the electron conducting moieties are at the periphery of the molecule to provide good orbital overlap with adjacent A-D-A molecules, facilitating electron transfer and/or conduction. Although these intermolecular interactions are not expected to form the sort of 3-D network seen for the π-interactions with fullerenes, it nonetheless provides an efficient mechanism for transporting charge out of the device. However, current A-D-A materials sublime and can only be solution processed.

SUMMARY OF THE INVENTION

In one aspect, the disclosure provides a symmetrical non-fullerene acceptor of formula (I):

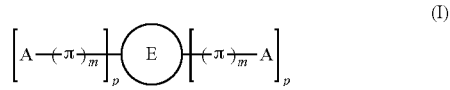

wherein E is a core chromophore group;
A is an electron accepting group;
π is a linking group;
m is an integer from 0 to 3; and
p is an integer from 1 to 3.
wherein each A is the same and each it is the same.

In one aspect, the disclosure provides a symmetrical donor of formula (II):

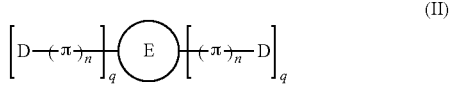

wherein E is a core chromophore group;
D is an electron donating group;
π is a linking group;
n is an integer from 0 to 3; and
q is an integer from 1 to 3;
wherein each D is the same and each it is the same.

In one aspect, the disclosure provides a symmetrical non-fullerene acceptor of formula (III):

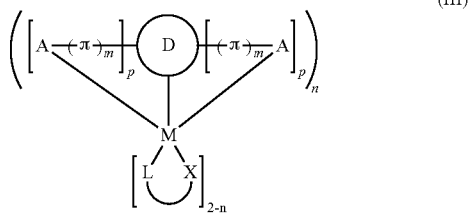

(III)

wherein A is an electron accepting group;
D is an electron donating group;
π is a linking group;
m is an integer from 0 to 3;
p is an integer from 1 to 3;
n is 1 or 2;
M is a divalent metal; and

represents a bidentate ligand;
wherein each A is the same

An OPV comprising the compound of the present disclosure is also disclosed.

BRIEF DESCRIPTION OF THE DRAWINGS

FIG. 2 depicts an example of various layers of a tandem or multi junction OPV device.

FIG. 4, comprising FIG. 4A and FIG. 4B, shows acceptor-donor-acceptor (A-D-A) groups and compounds. FIG. 4A shows Electron donor and acceptor groups for A-D-A compounds.

FIG. 4B shows A-D-A BODIPY compound with tricyanoethylene acceptors and the HO/LU make up for this molecule (HO=yellow, LU=blue mesh).

FIG. 7 shows possible core moieties that can be utilized as either the donor in the A-D-A molecules or as the acceptor in the D-A-D molecules.

FIG. 8 shows possible donor endcaps and structural modifications that can be utilized in D-A-D molecules.

FIG. 10, comprising FIG. 10A and FIG. 10B, shows exemplary compounds having a pi-bridge. FIG. 10A shows an exemplary D-π-A-π-D compound. FIG. 10B shows an exemplary A-π-D-π-A compound.

FIG. 12 shows possible pi-bridge groups and structural modifications that can be utilized in A-D-A molecules or D-A-D molecules.

FIG. 13, comprising FIG. 13A and FIG. 13B, shows π-π interactions. FIG. 13A shows the intermolecular π-stacking network expected for a tetrahedral metal complex (perpendicular to the page in black arrows and parallel in blue arrows). FIG. 13b shows a metal complex with two planar-tridentate ligands, illustrating the same perpendicular disposition as in a tetrahedral center.

FIG. 14 shows an example of a metal stabilized A-D-A ligand where n=1, 2 and M is a divalent metal ion. The MO analysis here was carried out on a zinc center with a single A-D-A ligand with a triazine accepting group (the other ligand is acetylacetonate). The HO is in yellow and the LU in blue mesh. A bis-ligated complex would have two of these tridentate ligands, coordinated orthogonal to each other.

FIG. 16 shows the synthesis of 1.
FIG. 17 shows the synthesis of 2.
FIG. 20 shows the synthesis of BPB.
FIG. 22 shows the synthesis of BPT.
FIG. 28 shows a table of emission characteristics at room 298 K and 77 K for BPM, BPB, and BPT.

DETAILED DESCRIPTION

Figure 1:
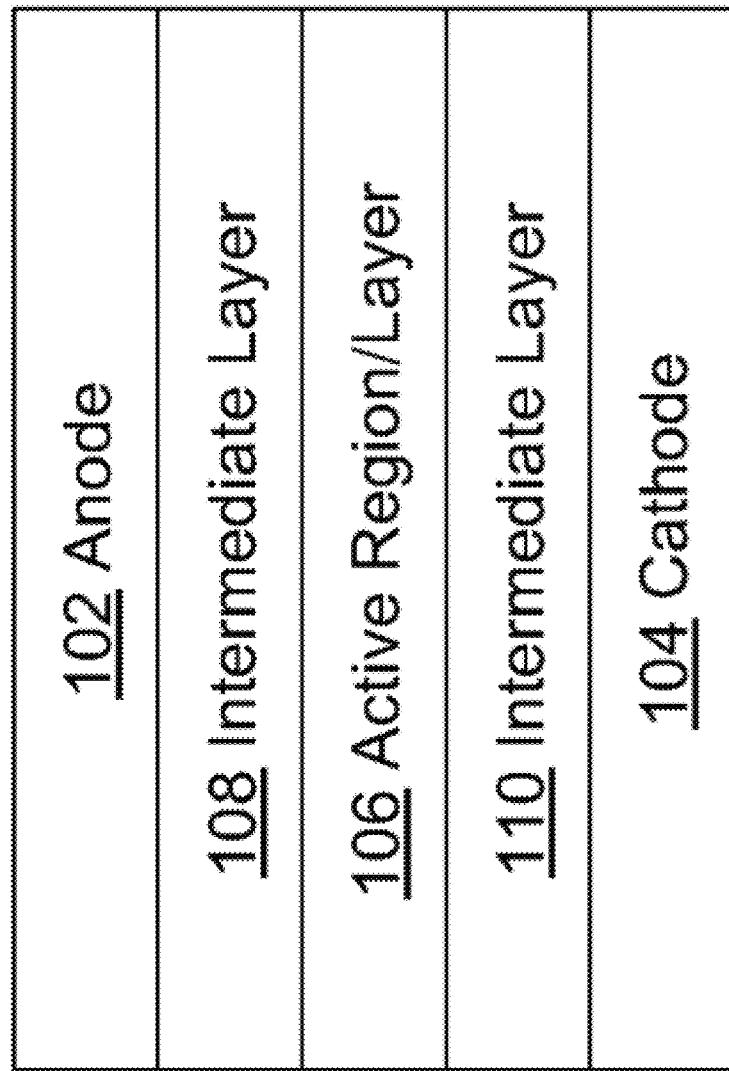
FIG. 1 depicts an example of various layers of a single junction solar cell or organic photovoltaic (OPV) device.
Figure 3:
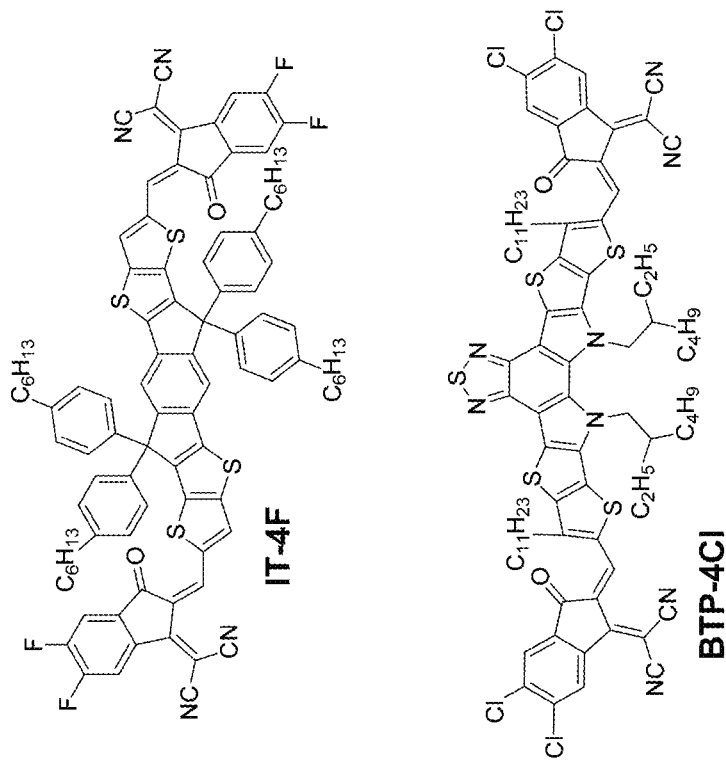
FIG. 3 shows Examples of non-fullerene acceptors that give high performance OPVs. A BHJ OPV with BTP-4Cl gives a power conversion efficiency (PCE) of 17%.
Figure 5:
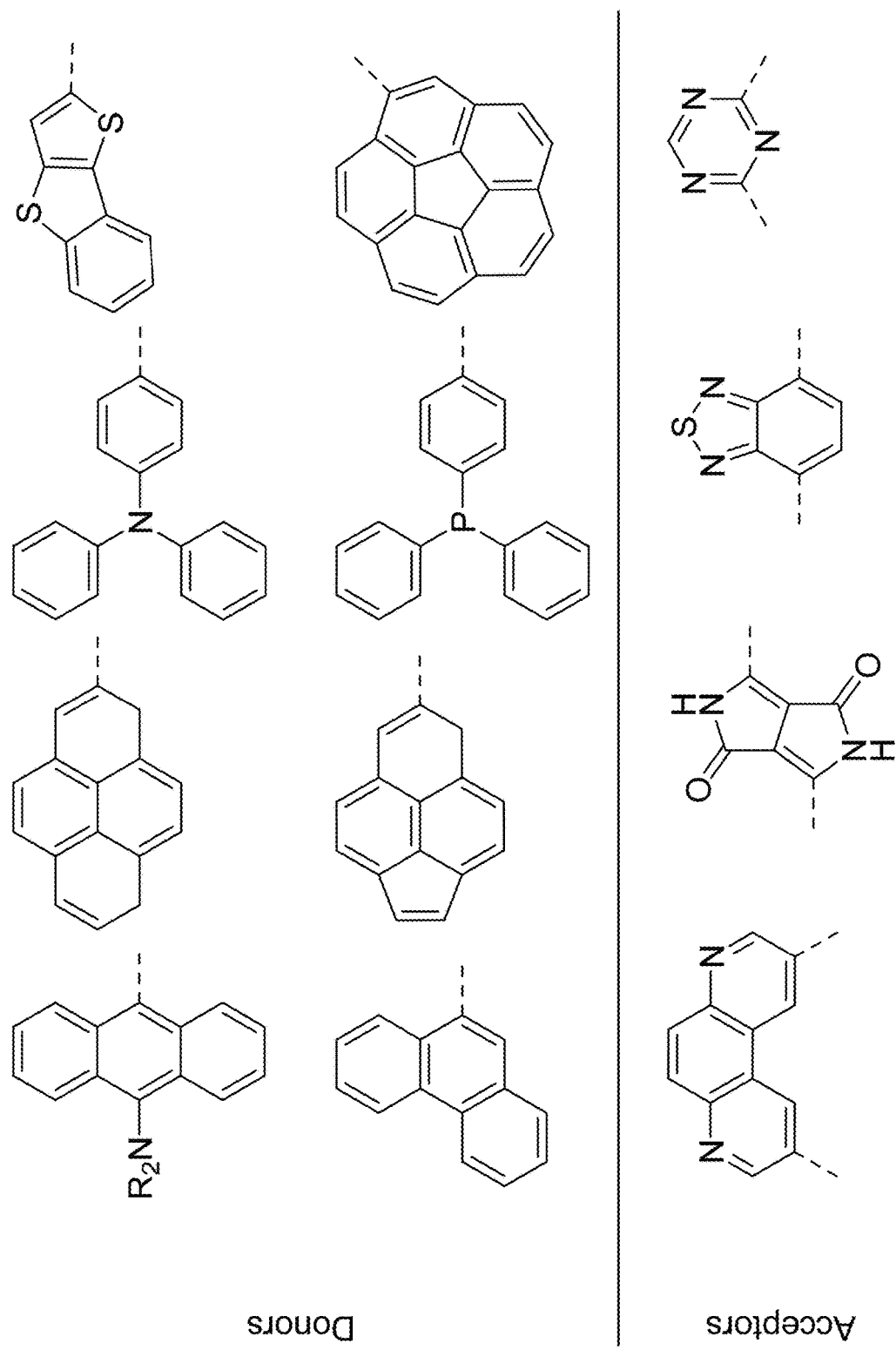
FIG. 5 shows electron donor and acceptor groups for donor-acceptor-donor (D-A-D) compounds.
Figure 6:
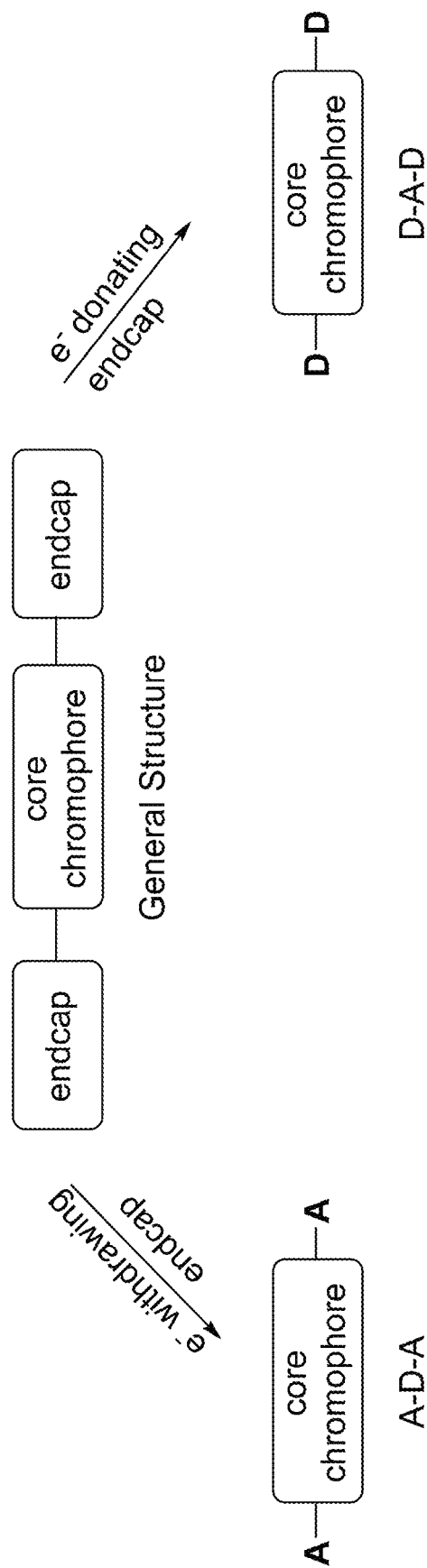
FIG. 6 shows a general schematic showing A-D-A or D-A-D motif

The disclosure provides novel non-fullerene acceptor compounds for use in OPVs. In one embodiment, the compounds disclosed herein have minimal overlap between the HO and LU orbitals will also have a small energy difference between the $S_1$ and $T_1$ CT states. In one embodiment, the compounds disclosed herein are symmetric, which eliminates a ground state dipole moment. In one embodiment, the compounds of the invention are acceptor-donor-acceptor molecules. In one embodiment, the lowest energy singlet excited state in the A-D-A molecule is localized on the core chromophore (D) and the $^{\delta-}$A-D$^+$-A$^{\delta-}$ singlet and triplet states are higher in energy, but thermally accessible at room temperature or above. In one embodiment, the core singlet is lower in energy than the $^{\delta-}$A-D$^+$-A$^{\delta-}$ singlet but higher than the $^{\delta-}$A-D$^+$-A$^{\delta-}$ triplet. In this case the core singlet is nested between the two $^{\delta-}$A-D$^+$-A$^{\delta-}$ states, being in dynamic and rapid equilibrium with them. In one embodiment, the core singlet lies above both the $^{\delta-}A\text{-}D^+\text{-}A^{\delta-}$ singlet and triplet states.

Various non-limiting examples of OPVs and compositions within various layers of an OPV are described in greater detail below.

Definitions

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, the terms "electrode" and "contact" may refer to a layer that provides a medium for delivering current to an external circuit or providing a bias current or voltage to the device. For example, an electrode, or contact, may provide the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to a material that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts or electrodes should be minimally absorbing and minimally reflecting of the incident electromagnetic radiation. In some cases, such a contact should be transparent or at least semi-transparent. In one embodiment, the transparent material may form at least part of an electrical contact or electrode.

As used herein, the term "semi-transparent" may refer to a material that permits some, but less than 50% transmission of ambient electromagnetic radiation in relevant wavelengths. Where a transparent or semi-transparent electrode is used, the opposing electrode may be a reflective material so that light which has passed through the cell without being absorbed is reflected back through the cell.

As used and depicted herein, a "layer" refers to a member or component of a device, for example an optoelectronic device, being principally defined by a thickness, for example in relation to other neighboring layers, and extending outward in length and width. It should be understood that the term "layer" is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the length and width may be disturbed or otherwise interrupted by other layer(s) or material(s).

As used herein, a "photoactive region" refers to a region of a device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, the term "band gap" ($E_g$) of a polymer may refer to the energy difference between the HOMO and the LUMO. The band gap is typically reported in electron volts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M^-)-(M^*+M)$, where $M^+$ and $M^-$ are the total energy of a positively and negatively charged molecule, respectively; $M^*$ and $M$ are the molecular energy at the first singlet state ($S_1$) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

As used herein, "power conversion efficiency" (PCE) ($\eta_p$) may be expressed as:

$$\eta_p = \frac{V_{OC} * FF * J_{SC}}{P_O}$$

wherein $V_{OC}$ is the open circuit voltage, FF is the fill factor, $J_{SC}$ is the short circuit current, and $P_O$ is the input optical power.

As used herein, "spin coating" may refer to the process of solution depositing a layer or film of one material (i.e., the coating material) on a surface of an adjacent substrate or layer of material. The spin coating process may include applying a small amount of the coating material on the center of the substrate, which is either spinning at low speed or not spinning at all. The substrate is then rotated at high speed in order to spread the coating material by centrifugal force. Rotation is continued while the fluid spins off the edges of the substrate, until the desired thickness of the film is achieved. The applied solvent is usually volatile, and simultaneously evaporates. Therefore, the higher the angular speed of spinning, the thinner the film. The thickness of the film also depends on the viscosity and concentration of the solution and the solvent.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Details on OLEDs, and the definitions described above, can be found in U.S. Pat. No. 7,279,704, which is incorporated herein by reference in its entirety.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

The term "boryl" refers to a —$B(R_s)_2$ radical or its Lewis adduct —B(Rs)3 radical, wherein Rs can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., Tetrahedron 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

In one aspect, the disclosure provides acceptor-donor-acceptor (A-D-A) and Donor-Acceptor-Donor (D-A-D) compounds for use as non-fullerene acceptors in OPVs.

In one embodiment, the A-D-A compound is a compound of formula (I):

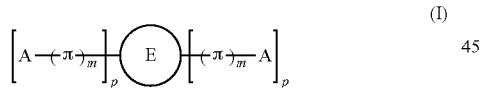

(I)

wherein E is a core chromophore group;
A is an electron accepting group;
π is a linking group;
m is an integer from 0 to 3; and
p is an integer from 1 to 3;
wherein each A is the same and each π is the same In one embodiment, in formula (I), E is a group represented by a formula selected from the group consisting of Formula (E-1) to Formula (E-22):

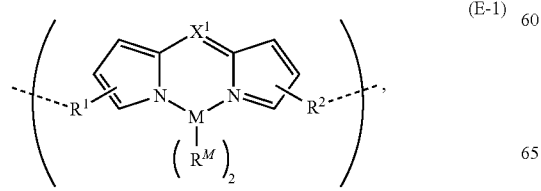
(E-1)

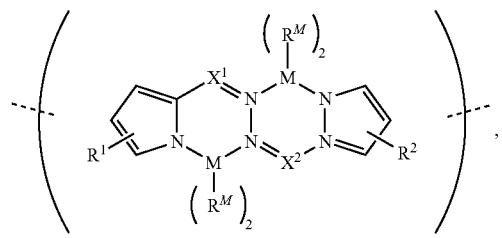
(E-2)

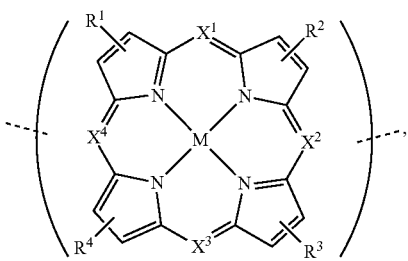
(E-3)

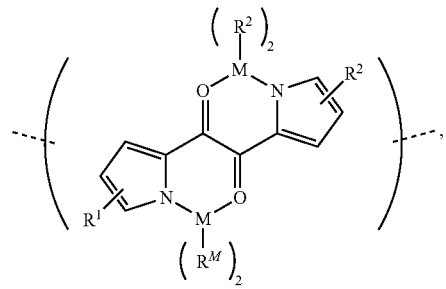
(E-4)

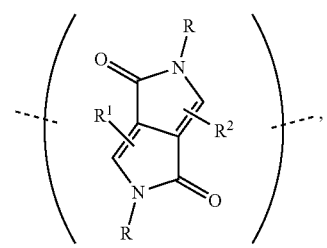
(E-5)

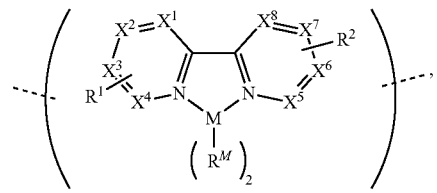
(E-6)

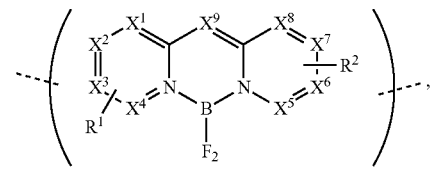
(E-7)

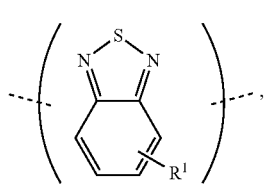
(E-8)

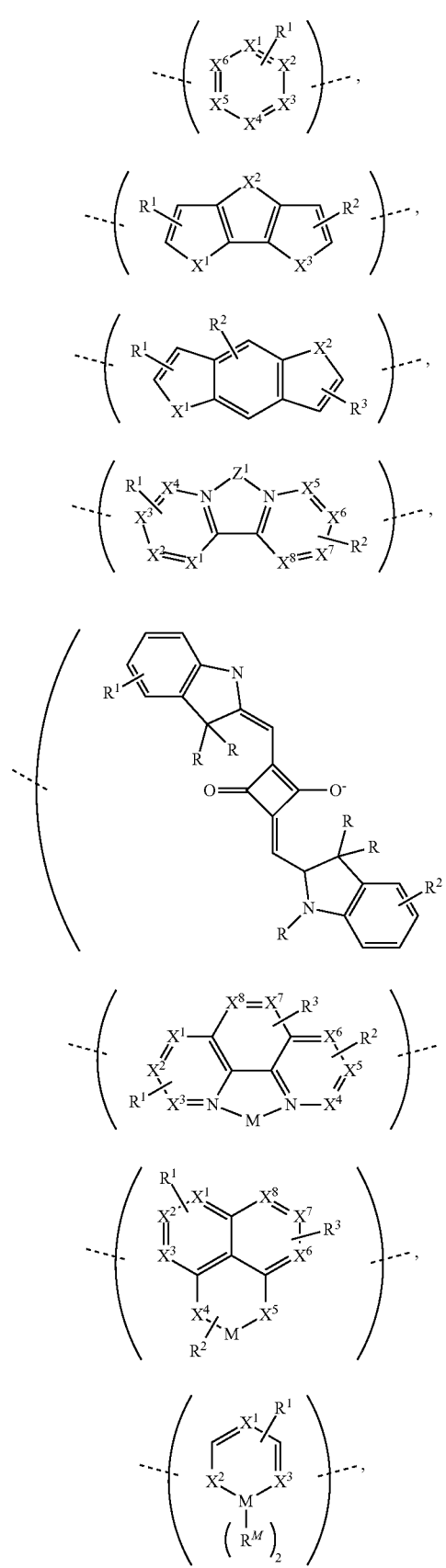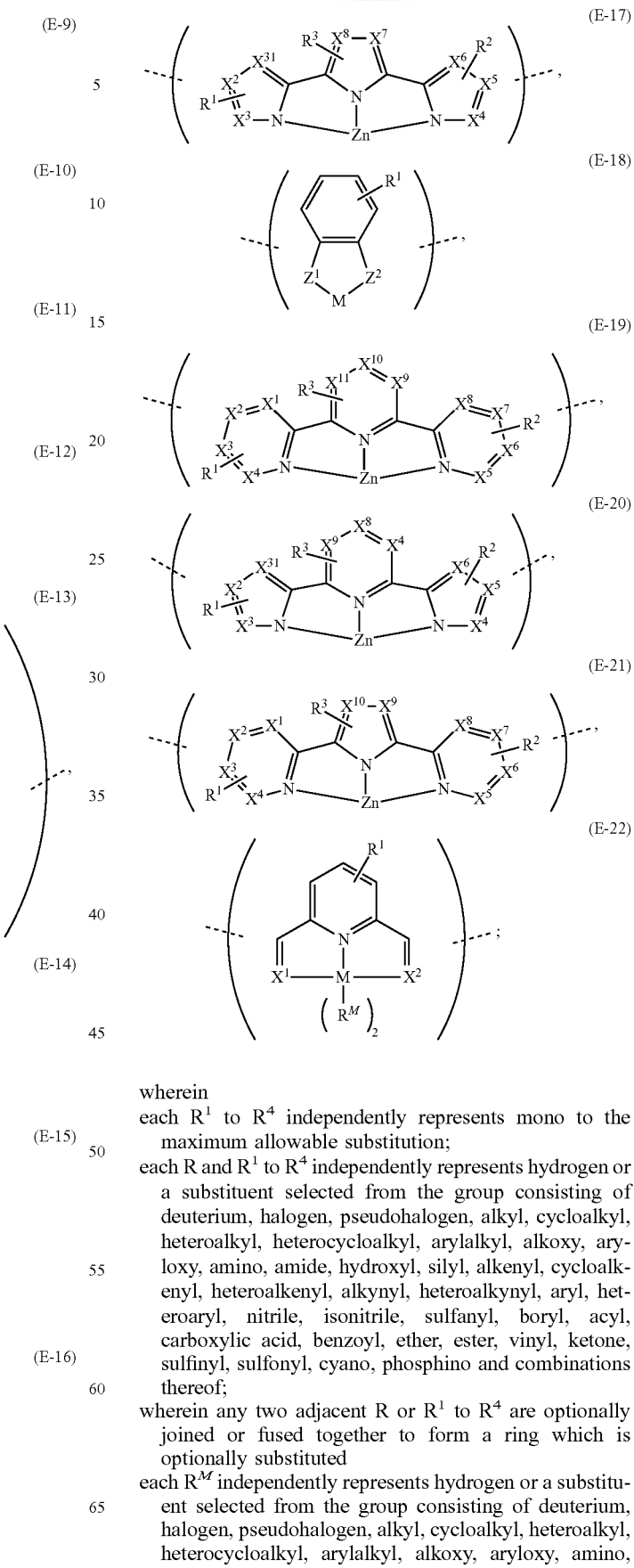

wherein
each $R^1$ to $R^4$ independently represents mono to the maximum allowable substitution;
each R and $R^1$ to $R^4$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;
wherein any two adjacent R or $R^1$ to $R^4$ are optionally joined or fused together to form a ring which is optionally substituted
each $R^M$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

each $X^1$ to $X^{11}$ independently represents C, Si, N or P;

each $Z^1$ and $Z^2$ independently represents $CR_2$, NR, O, or S; and

M is a trivalent atom, tetravalent atom, divalent atom or monovalent atom.

In one embodiment, M is B, Al, C, Si, Ge, Ti, Zr, Zn, Cd, Ca, Cu or Ag.

In one embodiment, each $R^M$ independently represents hydrogen or a substituent selected from the group consisting of halogen, pseudohalogen, alkyl, alkenyl, alkynyl, aryl, alkoxy, hydroxyl, and combinations thereof.

In one embodiment, in Formula (I), A is a group represented by a formula selected from the group consisting of Formula (A-1) to Formula (A-9):

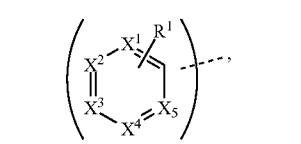 (A-1)

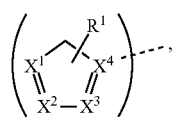 (A-2)

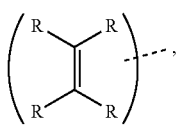 (A-3)

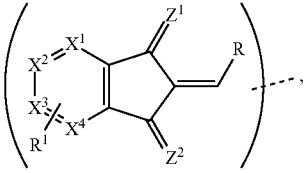 (A-4)

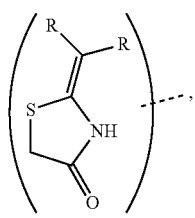 (A-5)

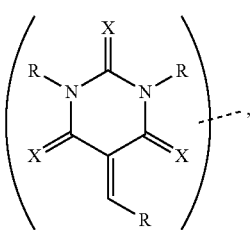 (A-6)

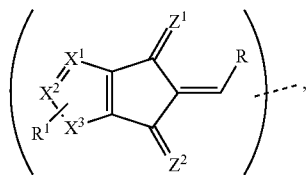 (A-7)

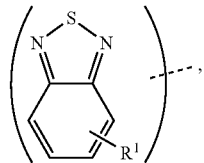 (A-8)

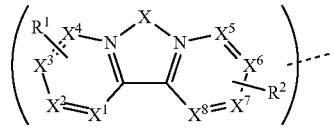 (A-9)

wherein each $R^1$ to $R^2$ independently represents mono to the maximum allowable substitution;

each R and $R^1$ to $R^2$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;

each $X^1$ to $X^8$ independently represents C, Si, N or P;

each X independently represents CR, SiR, N or P; and each $Z^1$ and $Z^2$ independently represents $CR_2$, NR, O, or S.

In one embodiment, in Formula (I), π is a group represented by a formula selected from the group consisting of Formula (P-1) to Formula (P-11):

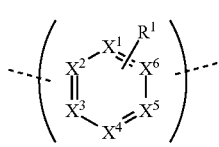 (P-1)

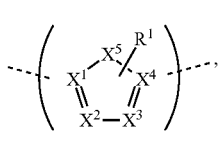 (P-2)

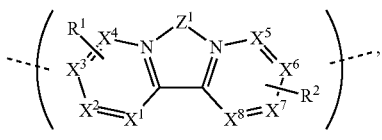 (P-3)

-continued

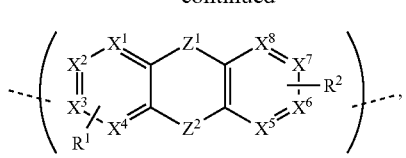 (P-4)

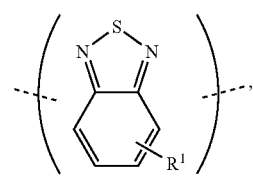 (P-5)

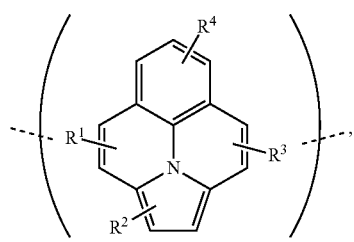 (P-6)

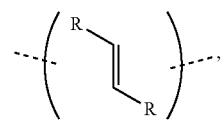 (P-7)

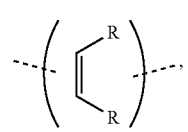 (P-8)

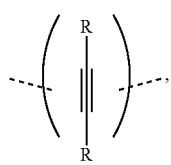 (P-9)

 (P-10)

 (P-11)

wherein
each $R^1$ to $R^4$ independently represents mono to the maximum allowable substitution;
each R and $R^1$ to $R^2$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;
each $X^1$ to $X^8$ independently represents C, Si, N or P; and
each $Z^1$ and $Z^2$ independently represents $CR_2$, NR, O, or S.

In one embodiment, each R and $R^1$ to $R^4$ independently represents hydrogen or a substituent selected from the group consisting of halogen, pseudohalogen, alkyl, alkenyl, alkynyl, aryl, heteroaryl, amino, amide, sulfonyl, alkoxy, hydroxyl, benzoyl, alkylthio, alkenyldioxy alkenyldithio, alkenyloxythio, vinyl, keto, carboxylic acid, a group of one of Formula (A-1) to Formula (A-9), a group of one of Formula (P-1) to Formula (P-11), and a group of one of (D-1) to (D-7):

1.

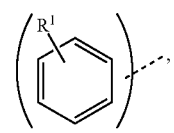 (D-1)

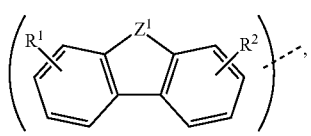 (D-2)

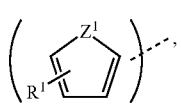 (D-3)

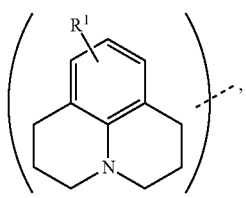 (D-4)

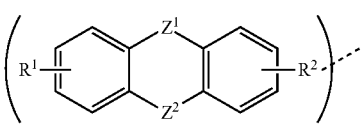 (D-5)

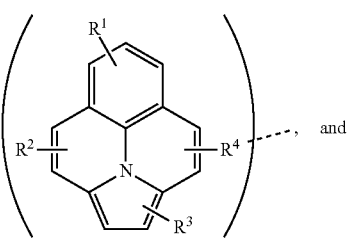 (D-6)

and

 (D-7)

wherein
each $R^1$ to $R^4$ independently represents mono to the maximum allowable substitution;
each R and $R^1$ to $R^4$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;

each $X^1$ to $X^8$ independently represents C, Si, N or P;

each X independently represents CR, SiR, N or P; and each $Z^1$ and $Z^2$ independently represents $CR_2$, NR, O, or S.

In one embodiment, in Formula (I), A is

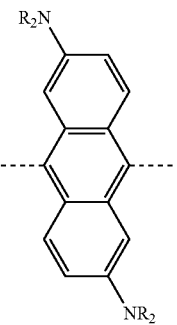

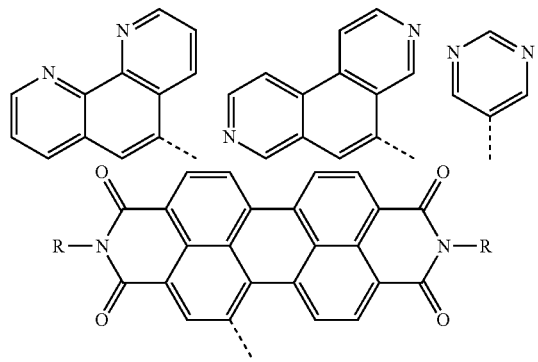

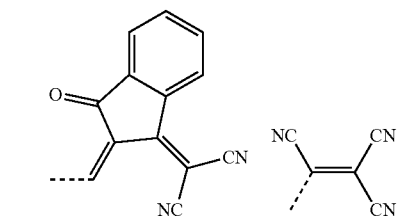

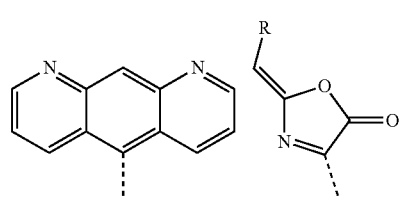

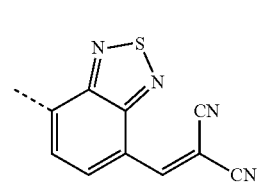

wherein each occurrence of R is hydrogen or a substituent.

In one embodiment, in Formula (I), E is

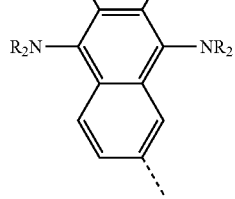

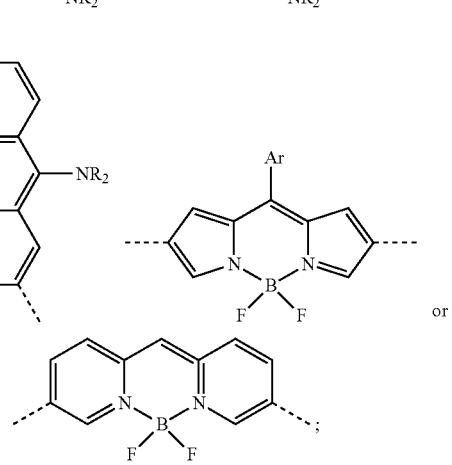

wherein each occurrence of R is hydrogen or a substituent, and Ar is an aryl group.

In one embodiment, the compound of formula (I) is

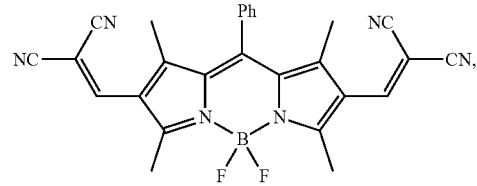

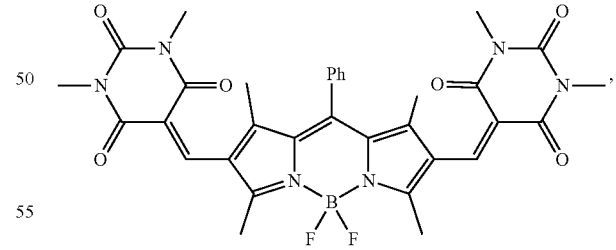

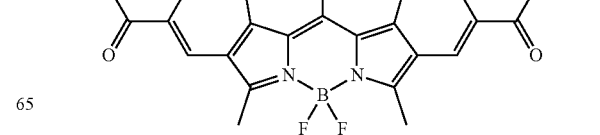

-continued

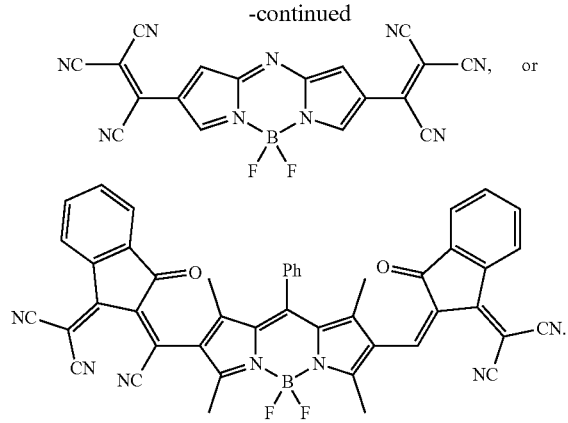

In one embodiment, the D-A-D compound is a compound of formula (II):

$$[D\!-\!(\pi)_n]_q\ E\ [(\pi)_n\!-\!D]_q \qquad (II)$$

wherein E is a core chromophore group;
D is an electron donating group;
π is a linking group;
n is an integer from 0 to 3; and
q is an integer from 1 to 3; wherein each D is the same and each π is the same In one embodiment, in formula (II),
E is a group represented by a formula selected from the group consisting of Formula (E-1) to Formula (E-22):

(E-1)

(E-2)

(E-3)

(E-4)

(E-5)

(E-6)

(E-7)

(E-8)

(E-9)

(E-10)

(E-11)

(E-12) 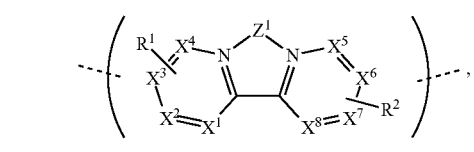

(E-13) 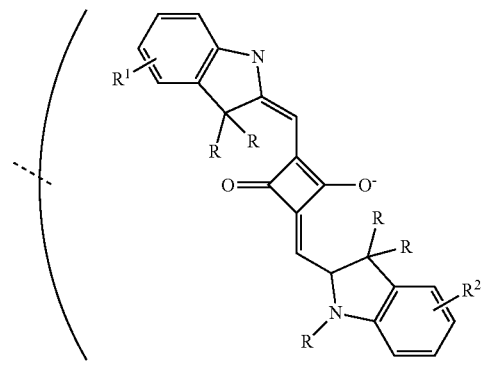

(E-14) 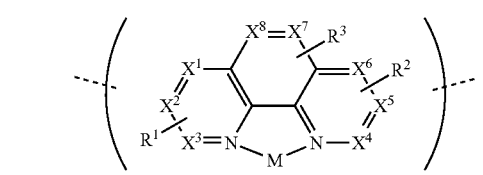

(E-15) 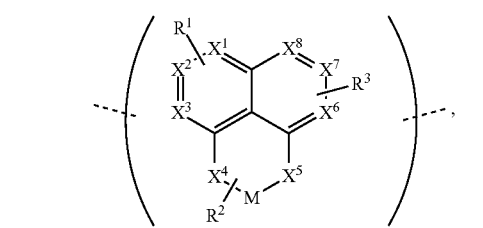

(E-16) 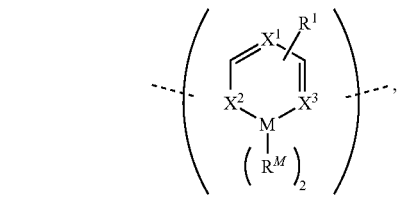

(E-17) 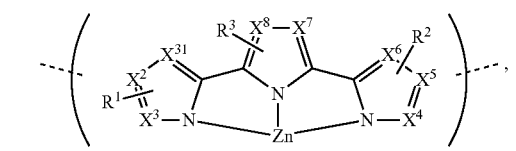

(E-18) 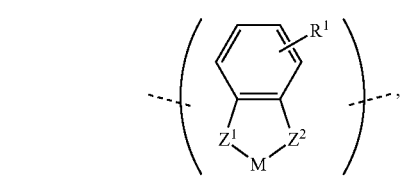

(E-19) 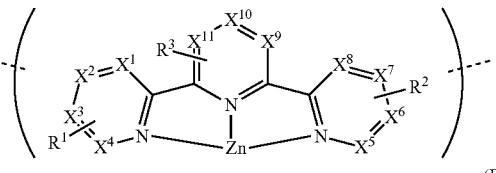

(E-20) 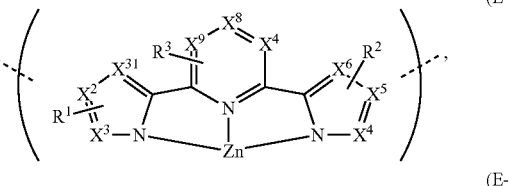

(E-21) 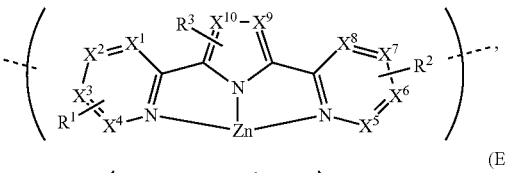

(E-22) 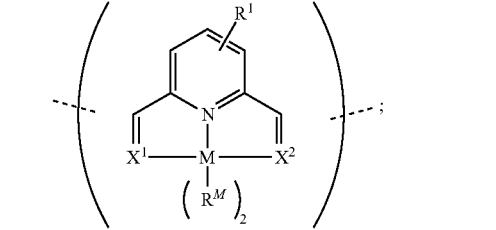

wherein
each $R^1$ to $R^4$ independently represents mono to the maximum allowable substitution;
each R and $R^1$ to $R^4$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;
wherein any two adjacent R or $R^1$ to $R^4$ are optionally joined or fused together to form a ring which is optionally substituted
each $R^M$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;
each $X^1$ to $X^{11}$ independently represents C, Si, N or P;
each $Z^1$ and $Z^2$ independently represents $CR_2$, NR, O, or S; and
M is a trivalent atom, tetravalent atom, divalent atom or monovalent atom.

In one embodiment, M is B, Al, C, Si, Ge, Ti, Zr, Zn, Cd, Ca, Cu or Ag.

In one embodiment, each $R^M$ independently represents hydrogen or a substituent selected from the group consisting of halogen, pseudohalogen, alkyl, alkenyl, alkynyl, aryl, alkoxy, hydroxyl, and combinations thereof.

In one embodiment, in formula (II), D is a group represented by a formula selected from the group consisting of Formula (D-1) to Formula (D-7):

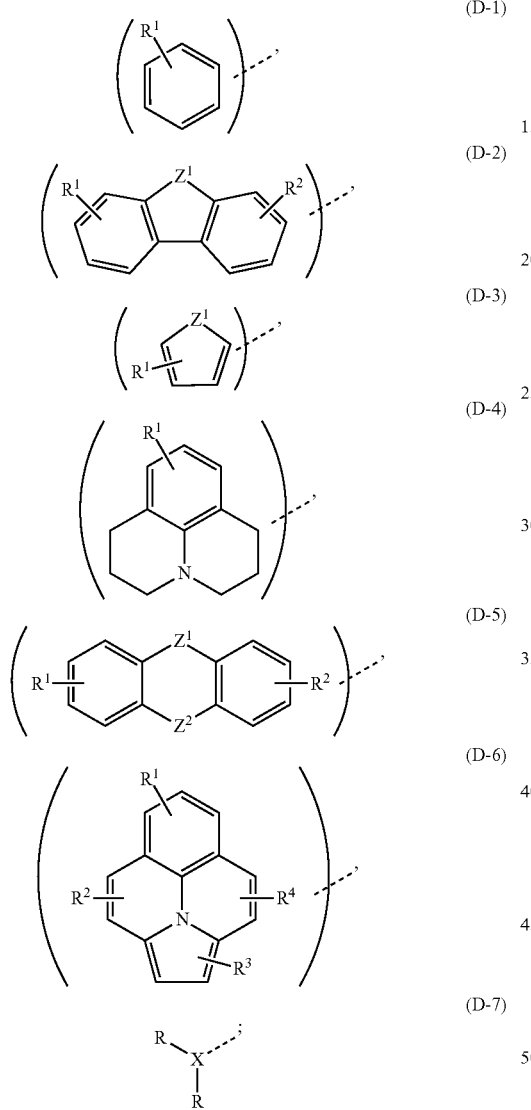

wherein each $R^1$ to $R^4$ independently represents mono to the maximum allowable substitution;

each R and $R^1$ to $R^4$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;

each X independently represents CR, SiR, N or P; and each $Z^1$ and $Z^2$ independently represents $CR_2$, NR, O, or S.

In one embodiment, in formula (II), π is a group represented by a formula selected from the group consisting of Formula (P-1) to Formula (P-11):

wherein each $R^1$ to $R^4$ independently represents mono to the maximum allowable substitution;

each R and $R^1$ to $R^2$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;

each $X^1$ to $X^8$ independently represents C, Si, N or P; and each $Z^1$ and $Z^2$ independently represents $CR_2$, NR, O, or S In one embodiment, in formula (II), each R and $R^1$ to $R^4$ independently represents hydrogen or a substituent selected from the group consisting of halogen, pseudohalogen, alkyl, alkenyl, alkynyl, aryl, heteroaryl, amino, amide, sulfonyl, alkoxy, hydroxyl, benzoyl, alkylthio, alkenyldioxy alkenyldithio, alkenyloxythio, vinyl, keto, carboxylic acid, a group of one of Formula (A-1) to Formula (A-9), a group of one of Formula (P-1) to Formula (P-11), and a group of one of (D-1) to (D-7).

In one embodiment, in formula II, D is

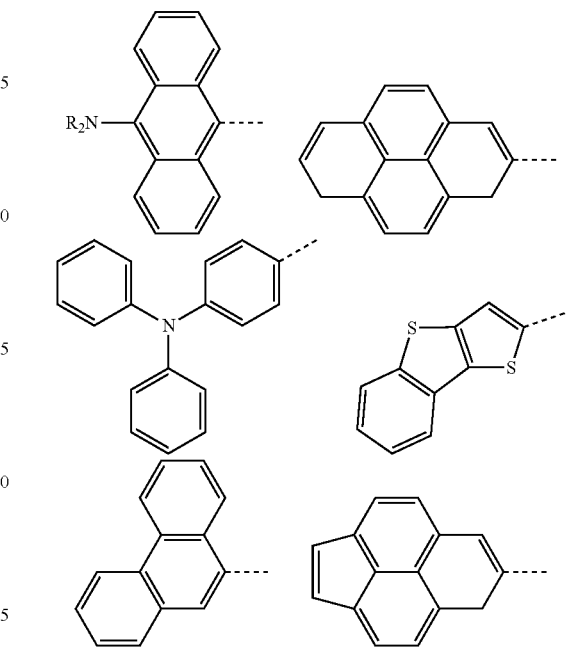

-continued

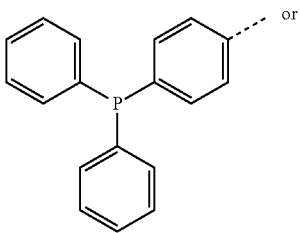

or

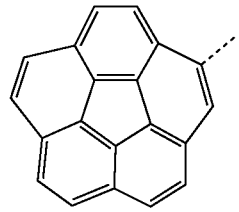

wherein R is hydrogen or a substituent.

In one embodiment, in formula (II), E is

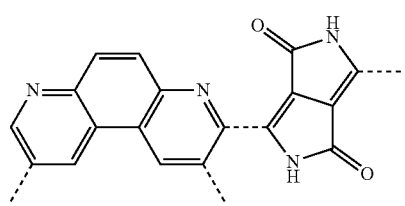

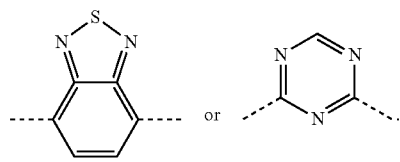

In another aspect, the disclosure provides compounds of Formula (III):

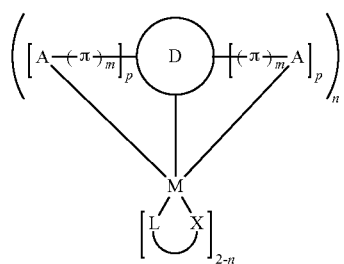

(III)

wherein A is an electron accepting group;
D is an electron donating group;
π is a linking group;
m is an integer from 0 to 3;
p is an integer from 1 to 3;

n is 1 or 2;
M is a divalent metal; and

represents a bidentate ligand;
wherein each A is the same.

In one embodiment, in formula (III), A is a group represented by a formula selected from the group consisting of Formula (A-1) to Formula (A-9):

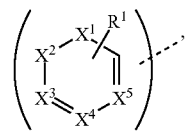

(A-1)

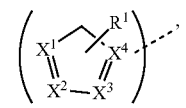

(A-2)

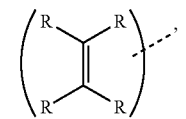

(A-3)

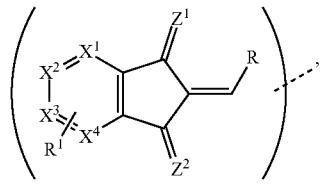

(A-4)

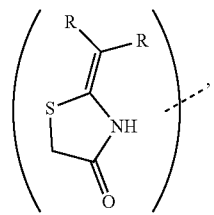

(A-5)

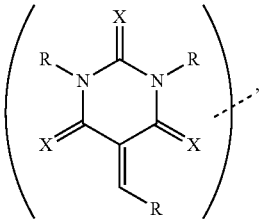

(A-6)

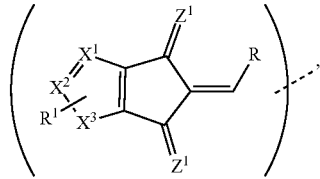

(A-7)

(A-8)

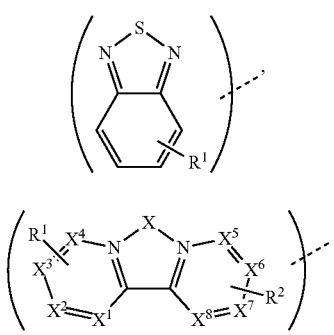

(A-9)

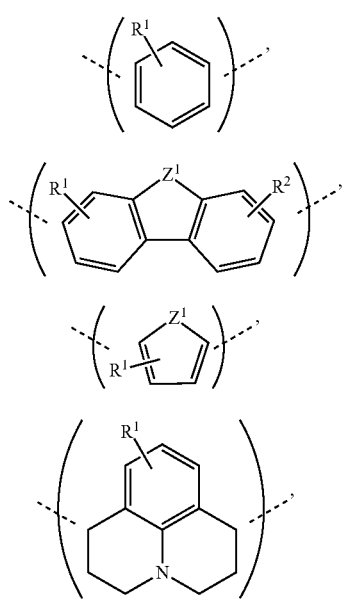

wherein each $R^1$ to $R^2$ independently represents mono to the maximum allowable substitution;

each R and $R^1$ to $R^2$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;

each $X^1$ to $X^8$ independently represents C, Si, N or P;

each X independently represents CR, SiR, N or P; and each $Z^1$ and $Z^2$ independently represents $CR_2$, NR, O, or S.

In one embodiment, in formula (III), D is a group represented by a formula selected from the group consisting of Formula (D-1) to Formula (D-7):

(D-1)

(D-2)

(D-3)

(D-4)

(D-5)

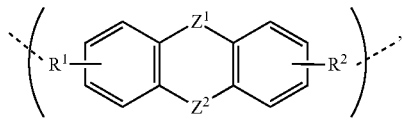

(D-6)

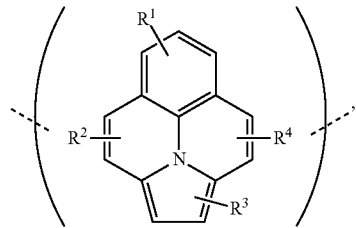

(D-7)

wherein
each $R^1$ to $R^4$ independently represents mono to the maximum allowable substitution;

each R and $R^1$ to $R^4$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;

each X independently represents CR, SiR, N or P; and each $Z^1$ and $Z^2$ independently represents $CR_2$, NR, O, or S.

In one embodiment, formula (III) is represented by formula (IIIa):

(IIIa)

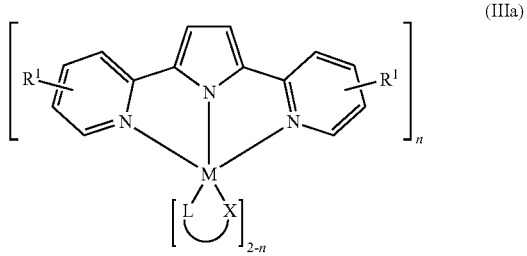

wherein each $R^1$ represents mono to the maximum allowable substitution;

each $R^1$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof n is 1 or 2;
wherein any two adjacent $R^1$ to are optionally joined or fused together to form a ring which is optionally substituted M is a divalent metal; and

represents a bidentate ligand;
wherein each $R^1$ is the same.

In one embodiment, in formula (IIIa), each $R^1$ is a group represented by a formula selected from the group consisting of Formula (A-1) to Formula (A-9).

In one embodiment, in one embodiment, the compound of formula (III) is

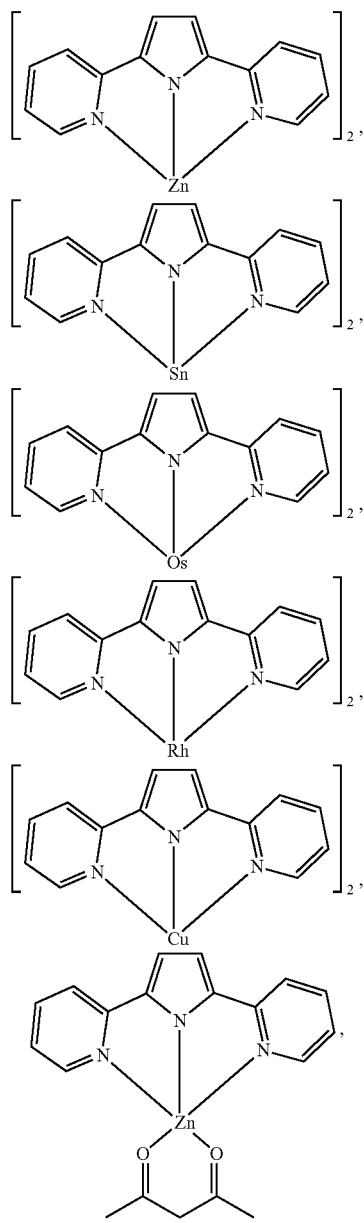

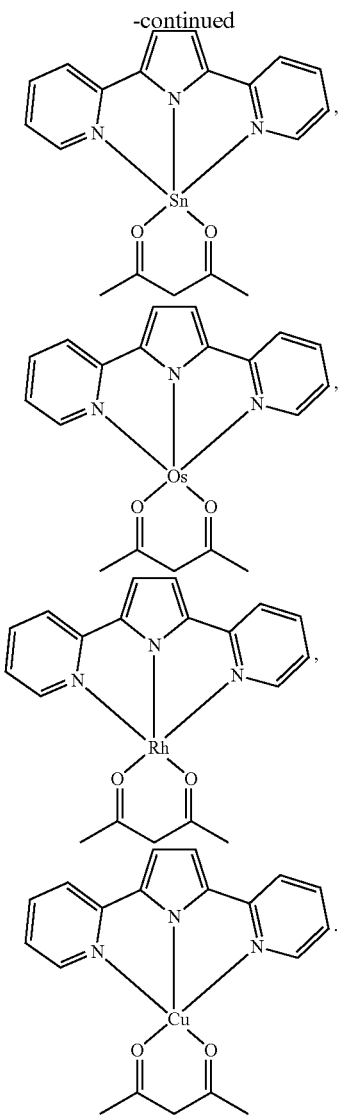

Organic Photovoltaic Cells

In one aspect, the invention relates to an OPV device comprising a compound of the disclosure. In one embodiment, the OPV device comprises a compound of formula (I), formula (II) or formula (III). In one embodiment, the OPV device includes an anode; a cathode; and an active material positioned between the anode and cathode, wherein the active material comprises a non-fullerene acceptor and a donor. In one embodiment, the non-fullerene acceptor comprises a compound of formula (I) or formula (III). In one embodiment, the non-fullerene acceptor comprises a compound of formula (I). In one embodiment, the non-fullerene acceptor comprises a compound of formula (III). In one embodiment, the donor comprises a compound of formula (II). In one embodiment, the non-fullerene acceptor comprises a compound of formula (I) or (III) and the donor comprises a compound of formula (II).

In one embodiment, the OPV device comprises a single-junction organic photovoltaic device 100 having a non-fullerene acceptor compound (FIG. 1). In one embodiment, the OPV device comprises two electrodes having an anode 102 and a cathode 104 in superposed relation, at least one donor composition, and at least one acceptor composition, wherein the donor-acceptor material or active layer 106 is positioned between the two electrodes 102 and 104. In one embodiment, one or more intermediate layers 108 may be positioned between the anode 102 and the active layer 106. Additionally, or alternatively, one or more intermediate layers 110 may be positioned between the active layer 106 and cathode 104.

In one embodiment, the anode 102 comprises a conducting oxide, thin metal layer, or conducting polymer. In one embodiment, the anode 102 comprises a conductive metal oxide. Exemplary conductive metal oxides include, but are not limited to, indium tin oxide (ITO), tin oxide (TO), gallium indium tin oxide (GITO), zinc oxide (ZO), and zinc indium tin oxide (ZITO). In one embodiment, the anode 102 comprises a metal layer. Exemplary metals for the metal layer include, but are not limited to, Ag, Au, Pd, Pt, Ti, V, Zn, Sn, Al, Co, Ni, Cu, Cr, and combinations thereof. In one embodiment, the metal layer comprises a thin metal layer. In one embodiment, the anode 102 comprises a conductive polymer. Exemplary conductive polymers include, but are not limited to, polyanaline (PANI), or 3,4-polyethyl-enedi-oxythiophene:polystyrenesulfonate (PEDOT:PSS). In one embodiment, thickness of the anode 102 is between about 0.1-100 nm. In one embodiment, thickness of the anode 102 is between about 1-10 nm. In one embodiment, thickness of the anode 102 is between about 0.1-10 nm. In one embodiment, thickness of the anode 102 is between about 10-100 nm. In one embodiment, anode 102 comprises a transparent or semi-transparent conductive material.

In one embodiment, the cathode 104 comprises a conducting oxide, a metal layer, or conducting polymer. Exemplary conducting oxide, metal layers, and conducting polymers are described elsewhere herein. In one embodiment, the cathode comprises a thin metal layer. In one embodiment, the cathode 104 comprises a metal or metal alloy. In one embodiment, the cathode 104 may comprise Ca, Al, Mg, Ti, W, Ag, Au, or another appropriate metal, or an alloy thereof. In one embodiment, the thickness of the cathode 104 is between about 0.1-100 nm. In one embodiment, the thickness of the cathode 104 is between about 1-10 nm. In one embodiment, the thickness of the cathode 104 is between about 0.1-10 nm. In one embodiment, the thickness of the cathode 104 is between about 10-100 nm. In one embodiment, cathode 104 comprises a transparent or semi-transparent conductive material.

In one embodiment, the OPV device may comprise one or more charge collecting/transporting intermediate layers positioned between an electrode 102, 104, and the active region or layer 106. In one embodiment, the OPV device comprises intermediate layer 108. In one embodiment, the OPV device comprises intermediate layer 110. In one embodiment, the OPV device comprises both intermediate layers 108 and 110. In one embodiment, intermediate layer 108 comprises a metal oxide. In one embodiment, intermediate layer 110 comprises a metal oxide. Exemplary metal oxides include, but are not limited to, $MoO_3$, $V_2O_5$, ZnO, and $TiO_2$. In one embodiment, the first intermediate layer 108 has the same composition as the second intermediate layer 110. In one embodiment, the first intermediate layer 108 and the second intermediate layer 110 have different compositions. In one embodiment, the thickness of intermediate layer 108 and intermediate layer 110 are each independently between about 0.1-100 nm. In one embodiment, the thickness of intermediate layer 108 and intermediate layer 110 are each independently between about 1-10 nm. In one embodiment, the thickness of intermediate layer 108 and intermediate layer 110 are each independently between about 0.1-10 nm. In one embodiment, the thickness of intermediate layer 108 and intermediate layer 110 are each independently between about 10-100 nm.

In one embodiment, the active region or layer 106 positioned between the electrodes 102 and 104 comprises a composition or molecule having an acceptor and a donor. In one embodiment, the acceptor comprises a non-fullerene acceptor. In one embodiment, the non-fullerene acceptor comprises a compound of formula (I) or formula (III). In one embodiment, the non-fullerene acceptor comprises a symmetrical compound of formula (I) or formula (III). In one embodiment, the donor comprises a compound of formula (II). In one embodiment, the donor comprises a symmetrical compound of formula (II). In one embodiment, the non-fullerene acceptor comprises a compound of formula (I) or (III) and the donor comprises a compound of formula (II).

In one embodiment, the OPV device comprises various layers of a tandem or multi-junction photovoltaic device 200 having a non-fullerene acceptor compound (FIG. 2). In one embodiment, the OPV device comprises two electrodes having an anode 202 and a cathode 204 in superposed relation, at least one donor composition, and at least one acceptor composition positioned within a plurality of active layers or regions 206A and 206B between the two electrodes 202 and 204. While only two active layers or regions 206A and 206B are depicted in FIG. 2, additional active layers or regions are also possible. In one embodiment, the anode 202 and the cathode 204 each independently comprise a conducting oxide, thin metal layer, or conducting polymer. Exemplary conducting oxides, metal layers, and conducting polymers are described elsewhere herein.

In one embodiment, the OPV device comprises one or more intermediate layers 208 positioned between the anode 202 and a first active layer 206A. Additionally, or alternatively, at least one intermediate layer 210 may be positioned between the second active layer 206B and cathode 204. In one embodiment, the OPV device comprises one or more intermediate layers 212 positioned between the first active layer 206A and the second active layer 206B. In one embodiment, the OPV device comprises intermediate layer 208. In one embodiment, the OPV device comprises intermediate layer 210. In one embodiment, the OPV device comprises intermediated layer 212. In one embodiment, the OPV device comprises both intermediate layers 208 and 210. In one embodiment, the OPV device comprises both intermediate layers 208 and 212. In one embodiment, the OPV device comprises both intermediate layers 210 and 212. In one embodiment, the OPV device comprises intermediate layers 208, 210, and 212. In one embodiment, intermediate layer 208 comprises a metal oxide. In one embodiment, intermediate layer 210 comprises a metal oxide. In one embodiment, intermediate layer 212 comprises a metal oxide. Exemplary metal oxides are described elsewhere herein. Exemplary thicknesses for intermediate layers 208, 210, and 212 are described elsewhere herein.

In one embodiment, the active region or layer 206A and 206B positioned between the electrodes comprises a composition or molecule having an acceptor and a donor. In one embodiment, the acceptor comprises a non-fullerene acceptor. In one embodiment, the non-fullerene acceptor comprises a compound of formula (I) or formula (III). In one embodiment, the non-fullerene acceptor comprises a symmetrical compound of formula (I) or formula (III). In one embodiment, the donor comprises a compound of formula (II). In one embodiment, the donor comprises a symmetrical compound of formula (II). In one embodiment, the nonfullerene acceptor comprises a compound of formula (I) or (III) and the donor comprises a compound of formula (II).

In one embodiment, the donor material or composition within the active layer or region 106 comprises a low energy band gap polymer composition. In one embodiment, the donor material or composition within each active layer or region 206A and 206B independently comprises a low energy band gap polymer composition. In one embodiment, the donor composition comprises a polymer having a band gap of less than 2 eV. In one embodiment, the low band gap polymer donor comprises poly[4,8-bis(5-(2-ethylhexyl)thiophen-2-yl)benzo [1,2-b:4,5-b']dithiophene-co-3-fluorothieno [3,4-b]thiophene-2-carboxylate, or a derivative thereof. In one embodiment, the low band gap polymer donor comprises poly(3-hexylthiophene) or a derivative thereof. In one embodiment, the low band gap polymer donor comprises poly[N-9'-heptadecanyl-2,7-carbazole-alt-5,5-(4',7'-di-2-thienyl-2',1',3'-benzothiadazole)] (i.e. PCDTBT), or a derivative thereof.

In one embodiment, the low energy band gap polymer is selected from the group consisting of:

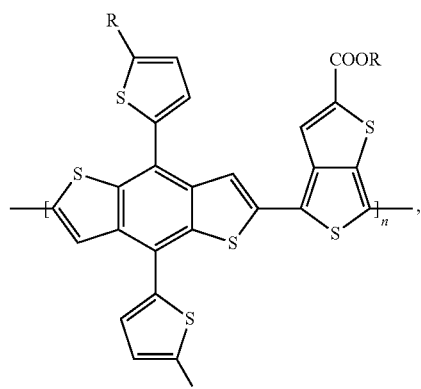

,

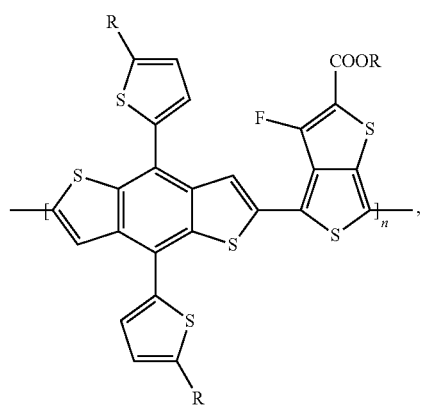

,

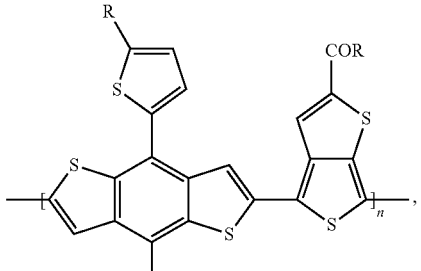

,

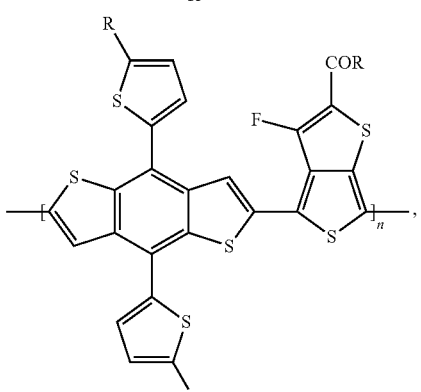

,

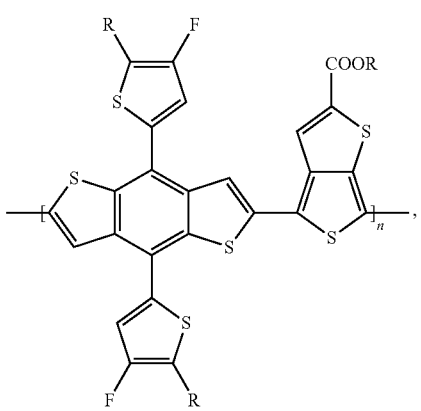

,

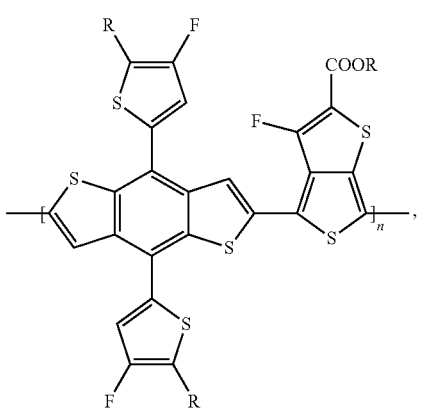

,

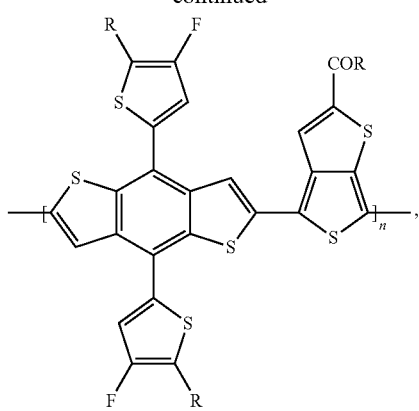
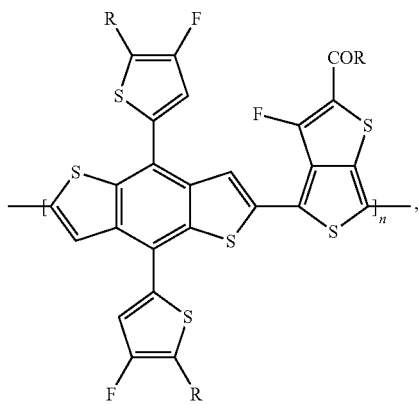
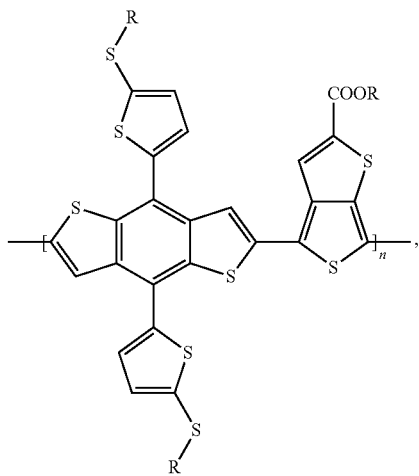
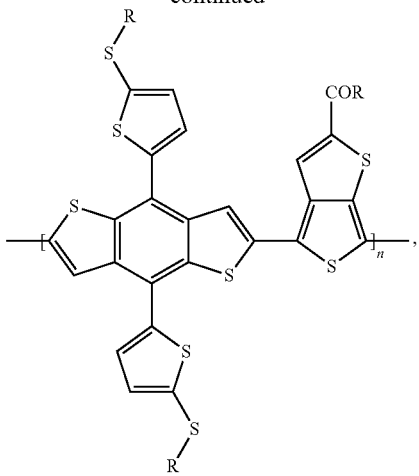
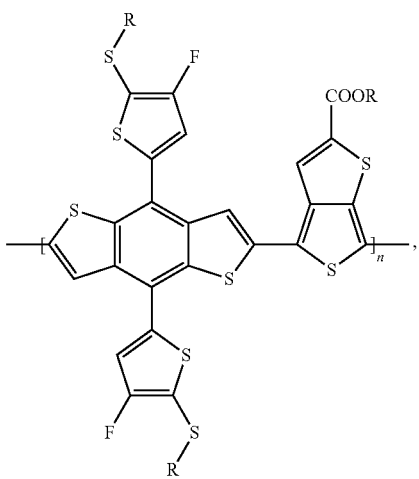
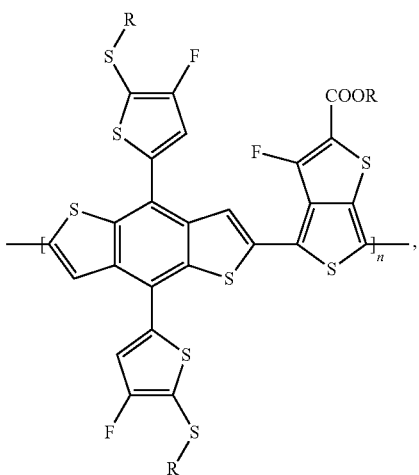

-continued

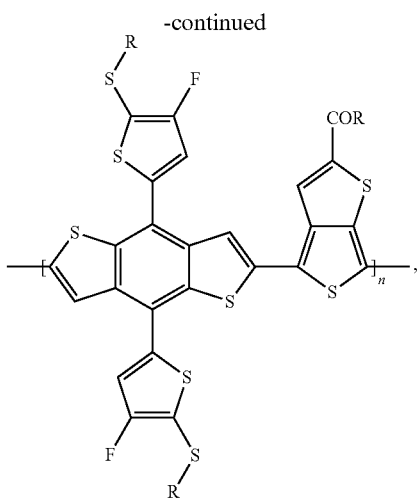

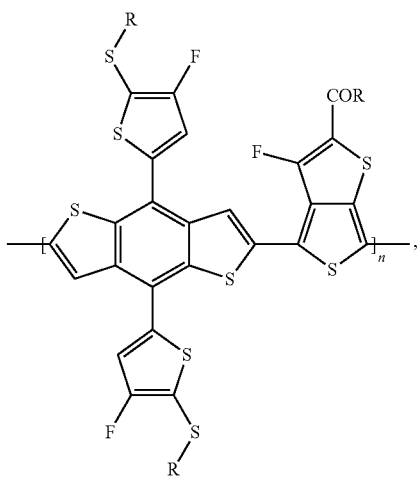

and derivatives thereof; wherein each R is independently a $C_1$-$C_{20}$ alkyl; and n is the degree of polymerization. In one embodiment each R is independently a $C_1$-$C_{20}$ linear alkyl. In one embodiment each R is independently a $C_1$-$C_{20}$ branched alkyl. In one embodiment, each R is independently selected from the group consisting of methyl, ethyl, n-propyl, isopropyl, isobutyl, n-butyl, sec-butyl, tert-butyl, isopentyl, n-pentyl, neopentyl, n-hexyl, 2-ethylhexyl, and octyl. In In one embodiment, each R represents 2-ethylhexyl. In one embodiment, n is between about 1-1000. In one embodiment, n is between about 1-100. In one embodiment, n is between about 10-1000.

In one embodiment, the donor is:

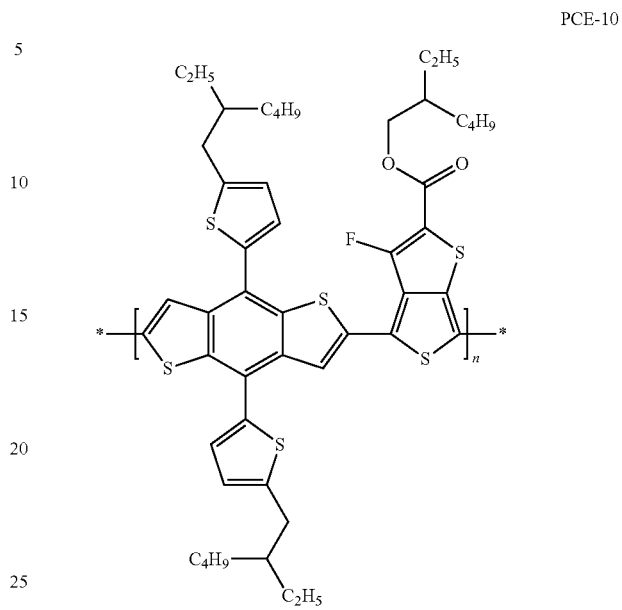

PCE-10

In one embodiment, an OPV device comprising a non-fullerene acceptor of formula (I) or formula (III) or a donor of formula (II) demonstrates improved performance properties over OPV devices comprising fullerene acceptors. In one embodiment, compounds disclosed herein have minimal overlap between the HO and LU orbitals will also have a small energy difference between the $S_1$ and $T_1$ CT states. In one embodiment, the HO/LU overlap to provide sufficient oscillator strength. In one embodiment, the oscillator strength is greater than $10^4$ cm$^{-1}$. In one embodiment, the increase lifetime without losing the $S_1/T_1$ exchange energy.

In one embodiment, an OPV device comprising a non-fullerene acceptor of formula (I) or (III) or donor of formula (II) has a high open circuit voltage ($V_{OC}$). In one embodiment, the $V_{OC}$ is at least about 0.5 V, at least about 0.6 V, at least about 0.7 V, at least about 0.8 V, at least about 0.9 V, or at least about 1 V. In one embodiment, the $V_{OC}$ is between about 0.1 V and 5 V. In one embodiment, the $V_{OC}$ is between about 0.1 V and 4.5 V. In one embodiment, the $V_{OC}$ is between about 0.1 V and 4 V. In one embodiment, the $V_{OC}$ is between about 0.1 V and 3.5 V. In one embodiment, the $V_{OC}$ is between about 0.1 V and 3 V. In one embodiment, the $V_{OC}$ is between about 0.1 V and 2.5 V. In one embodiment, the $V_{OC}$ is between about 0.1 V and 2 V. In one embodiment, the $V_{OC}$ is between about 0.1 V and 1.5 V. In one embodiment, the $V_{OC}$ is between about 0.1 V and 1 V. In one embodiment, the $V_{OC}$ is between about 0.5 V and 1 V.

In one embodiment, an OPV device comprising a non-fullerene acceptor of formula (I) or (III) or donor of formula (II) has a high short circuit current ($J_{SC}$). In one embodiment, the $J_{SC}$ is between about 5 mA/cm$^2$ and about 70 mA/cm$^2$. In one embodiment, the $J_{SC}$ is between about 5 mA/cm$^2$ and about 60 mA/cm$^2$. In one embodiment, the $J_{SC}$ is between about 5 mA/cm$^2$ and about 50 mA/cm$^2$. In one embodiment, the $J_{SC}$ is between about 5 mA/cm$^2$ and about 40 mA/cm$^2$. In one embodiment, the $J_{SC}$ is between about 5 mA/cm$^2$ and about 30 mA/cm$^2$. In one embodiment, the $J_{SC}$ is between about 10 mA/cm$^2$ and about 30 mA/cm$^2$. In one embodiment, the $J_{SC}$ is between about 15 mA/cm$^2$ and about 30 mA/cm$^2$. In one embodiment, the $J_{SC}$ is between about 15 mA/cm$^2$ and about 25 mA/cm$^2$.

In one embodiment, an OPV device comprising a non-fullerene acceptor of formula (I) or (III) or donor of formula (II) has a high external quantum efficiency (EQE). In one embodiment, the EQE is between about 10% and 90%. In one embodiment, the EQE is between about 10% and 80%. In one embodiment, the EQE is between about 20% and 80%. In one embodiment, the EQE is between about 30% and 80%. In one embodiment, the EQE is between about 40% and 80%. In one embodiment, the EQE is between about 50% and 80%. In one embodiment, the EQE is between about 60% and 80%. In one embodiment, the EQE is between about 65% and 80%.

EXPERIMENTAL EXAMPLES

The A-D-A and D-A-D compounds presented herein achieve the same high performance as the reported non-fullerene acceptors. These compounds are readily synthesized and are stable to both solution and vacuum processing. Organic A-D-A Compounds as Non-Fullerene Acceptors The A-D-A compounds described herein support intra-molecular charge transfer and promote electron conduction through the peripheral electron accepting groups. The structures are symmetric to minimize or eliminate a ground state dipole moment. The donor and acceptors are connected by conjugating linkages so as to promote rapid formation of a CT excited state by intramolecular electron transfer, with the electron on the periphery of the molecule and the hole largely localized at the core. The D-A coupling is sufficiently weak that the hole and electron wavefunctions will not significantly overlap, leading to long excited state lifetimes.

The A-D-A structural motif molecules have minimal overlap between the HO and LU orbitals and also have a small energy difference between the $S_1$ and $T_1$ CT states. This feature has been exploited in organic LEDs, where thermally assisted delayed fluorescence (TADF) is used to get strong $S_1$ emission from otherwise dark $T_1$ states. In these TADF dyes the $S_1/T_1$ gaps can be as low as 1000 cm$^{-1}$, such that thermally populating the $S_1$ from the $T_1$ is efficient at room temperature. Even with this small energy gap the decay time of the TADF emitter is in the microsecond regime. While strong emission is not required for an OPV material, a long-lived excited state lifetime is highly desirable. Utilizing triplet excited states is often discounted as a useful path for OPVs, because of the large energy loss typically observed in crossing from the singlet to the triplet. The design of A-D-A compounds that give $^{\delta-}$A-D$^+$-A$^{\delta-}$ states that have a small $S_1/T_1$ energy gap, the triplet character can be used to markedly increase lifetime without sacrificing too much to the $S_1/T_1$ exchange energy. However, small HO/LU overlap also leads to a comparatively small oscillator strength for the CT transition, which will lead to a low molar absorptivity and limit the $J_{SC}$. Suitable sets of donor and acceptor groups give the molecule sufficient HO/LU overlap to provide sufficient oscillator strength ($\alpha > 10^4$ cm$^{-1}$) and a relatively small $S_1/T_1$ exchange energy, to maximize $V_{OC}$ while mitigating deleterious effects on $J_{SC}$.

Thus, the A-D-A compounds described herein have three modes of action. Note that in all cases the core chromophore (D in A-D-A) has a high extinction coefficient for light absorption in the visible or red/NIR part of the spectrum. In one aspect, the lowest energy singlet excited state is localized on the core chromophore (D) and the $^{\delta-}$A-D$^+$-A$^{\delta-}$ singlet and triplet states are higher in energy, but thermally accessible at room temperature or above. Thus, the core localized singlet and the CT states will be in dynamic and rapid equilibrium. In another aspect, the core singlet is lower in energy than the $^{\delta-}$A-D$^+$-A$^{\delta-}$ singlet but higher than the $^{\delta-}$A-D$^+$-A$^{\delta-}$ triplet. In this case the core singlet is nested between the two $^{\delta-}$A-D$^+$-A$^{\delta-}$ states, again being in dynamic and rapid equilibrium with them. In another aspect, the core singlet lies above both the $^{\delta-}$A-D$^+$-A$^{\delta-}$ singlet and triplet states. The energy difference should be kept to a minimum since this will result in a loss of energy from the absorbed photon.

The materials described herein specifically target these design characteristics of A-D-A acceptors, but with much simpler structures than many of the non-fullerene acceptors reported to date. Examples of electron donor and acceptor groups are given in FIG. 4. These groups were chosen due to their ease of synthesis and the facile chemistries available to couple them. Several of the A-D-A compounds that could be constructed with the donor/acceptor groups in FIG. 4 will not have low energy absorption bands. For example, DFT calculations predict that the HO and LU energies for an A-D-A with a phenanthrene acceptor and a tetramethyl-phenylenediamine donor will be −5.25 and −1.53 eV, respectively and it will absorb with moderate efficiency in the low 400 nm range. The initial goal in studying A-D-A materials with these groups is to see if the A-D-A motif is a general one for generating long lived CT states that can be used electron accepting materials in OPVs, however, by shifting donor and acceptor groups the absorbance window can be shifted throughout the visible spectrum.

A key question is if these A-D-A materials will promote CT directly or if optical excitation of the donor or acceptor group, followed by CT formation from the Si (as in symmetry breaking CT) will be sufficient to access the CT state. A-D-A compounds are prepared and tested with high E dyes at their cores to serve as the donor group. These materials are well suited to a process involving optical excitation of the core, followed by charge transfer. For example, the high molar absorptivity for BODIPY in an A-D-A compound with a BODIPY core ensures efficient formation of an Si state on BODIPY upon excitation, which will rapidly transfer charge to the pendent acceptor groups. An example of such a A-D-A BODIPY compound is shown in FIG. 2B. As expected, the HO and LU orbitals have a small degree of overlap, but notably the TCNE acceptor groups do participate in the LU orbitals. The HO and HO-1 orbitals are nearly completely BODIPY based. The LU is largely BODIPY, but the LU+1 and LU+2 orbitals are nearly completely localized on the acceptor moiety. A polar environment could stabilize the CT state and give the excited state substantial CT character. The calculated absorbance energy for this A-D-A compound is 700 nm, with an oscillator strength of 0.7. Note that this is the same wavelength range that BTP-4Cl (FIG. 4) absorbs in, but this BODIPY-TCNE complex is a far simpler structure. The use of a dye core in the A-D-A compounds may give both high optical absorptivity and low HO/LU coupling.

It is important to note that this disclosure is not only tied to A-D-A based acceptors, but also includes D-A-D donor molecules. The decision over whether a given moiety is a donor or acceptor has to do with the relative energies of the filled and vacant orbitals. The core chromophore, i.e. D in A-D-A and A in D-A-D, has filled and vacant orbitals in its ground state, typically designated as $\pi$ and $\pi^*$, respectively. As described above, endcap substituents are added to the core to make a $^{\delta-}$A-D$^+$-A$^{\delta-}$ excited state the lowest energy excited state or the next to lowest with an energy making it in thermal equilibrium with the $S_1$. In this CT excited state the core has its $\pi$ orbital oxidized by one electron and the acceptors reduced by one electron. It is easy to see that a similar condition can be achieved with a D-A-D molecule if a endcap is chosen that gives a CT excited state that involves oxidation of the donor and reduction of the π * of the core chromophore in $^{\delta}$D-A$^{+}$-D$^{\delta-}$ The three conditions for the relative energies of the core chromophore and the singlet and triplet CT states of A-D-A molecules hold for D-A-D materials as well. While the A-D-A materials are expected to be electron accepting materials in an OPV, the D-A-D system are donors in OPVs. The A-D-A acceptors can be paired with a D-A-D donor or with a donor that does not involve CT excited states, such as polycyclicaromatichydrocarbon donors. Similarly, the D-A-D donors can be paired with a A-D-A acceptor or with an acceptor that does not involve CT excited states, such as fullerenes.

Figure 9:
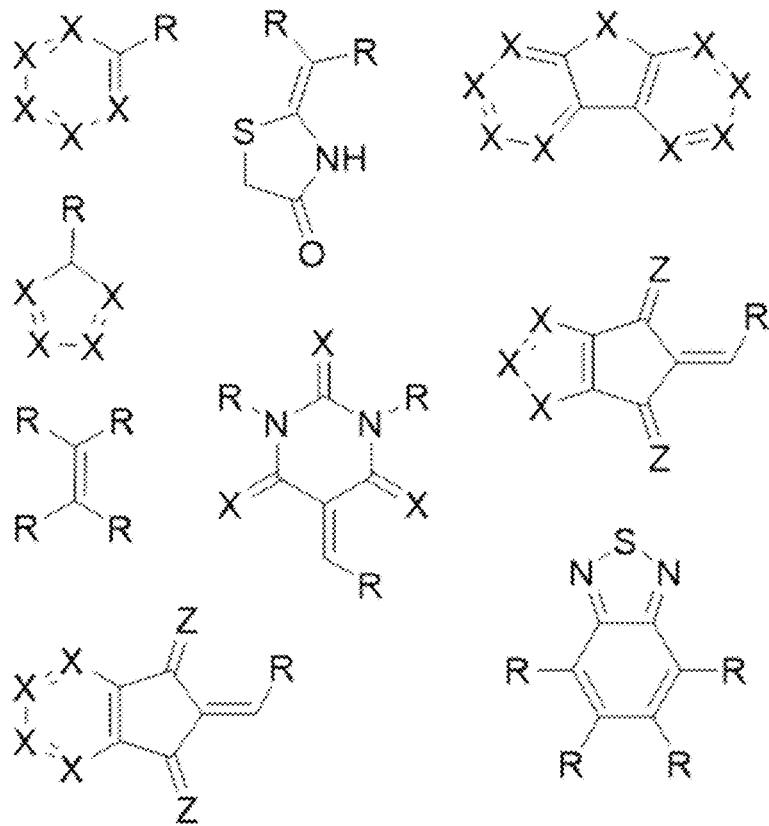
FIG. 9 shows possible donor acceptor and structural modifications that can be utilized in A-D-A molecules.

FIGS. 6-9 illustrate examples A-D-A and D-A-D materials for OPVs. The simplest schematic is shown first. FIG. 7 includes specific core chromophores, known to have high extinction coefficients for light absorption. FIGS. 8 and 9 shows suitable endcaps. The endcaps are placed in matching pairs, symmetrically on either side of the core chromophore. An A-D-A or D-A-D molecule can have one, two or three pairs of endcaps. These pairs can be the same or different, but the two endcaps within a pair must be the same.

Additionally, use of an individual or series of conjugated π-bridges can be employed between the core and endcaps to produce A-π-D-π-A and D-π-A-π-D molecules. This π-bridge can be used to redshift the absorption spectra of the overall molecule, change steric dynamics in a molecule, and affect vacuum deposition behavior in device fabrication. These molecules maintain the above relative charge association in the CT excited state, that is excited states in the form of $^{\delta-}$A-π-D$^{+}$-π-A$^{\delta-}$ or $^{\delta+}$D-π-A$^{-}$-π-D$^{\delta+}$. The three conditions for the relative energies of the local singlet excited state featured predominately on the core chromophore with the singlet and triplet CT states are maintained in these structures. Likewise, the role of the two molecular architypes in OPV devices match those of their parent structures, A-π-D-π-A molecules are well suited for use as an electron acceptor material while D-π-A-π-D are well suited for use as an electron donor material.

Figure 11:
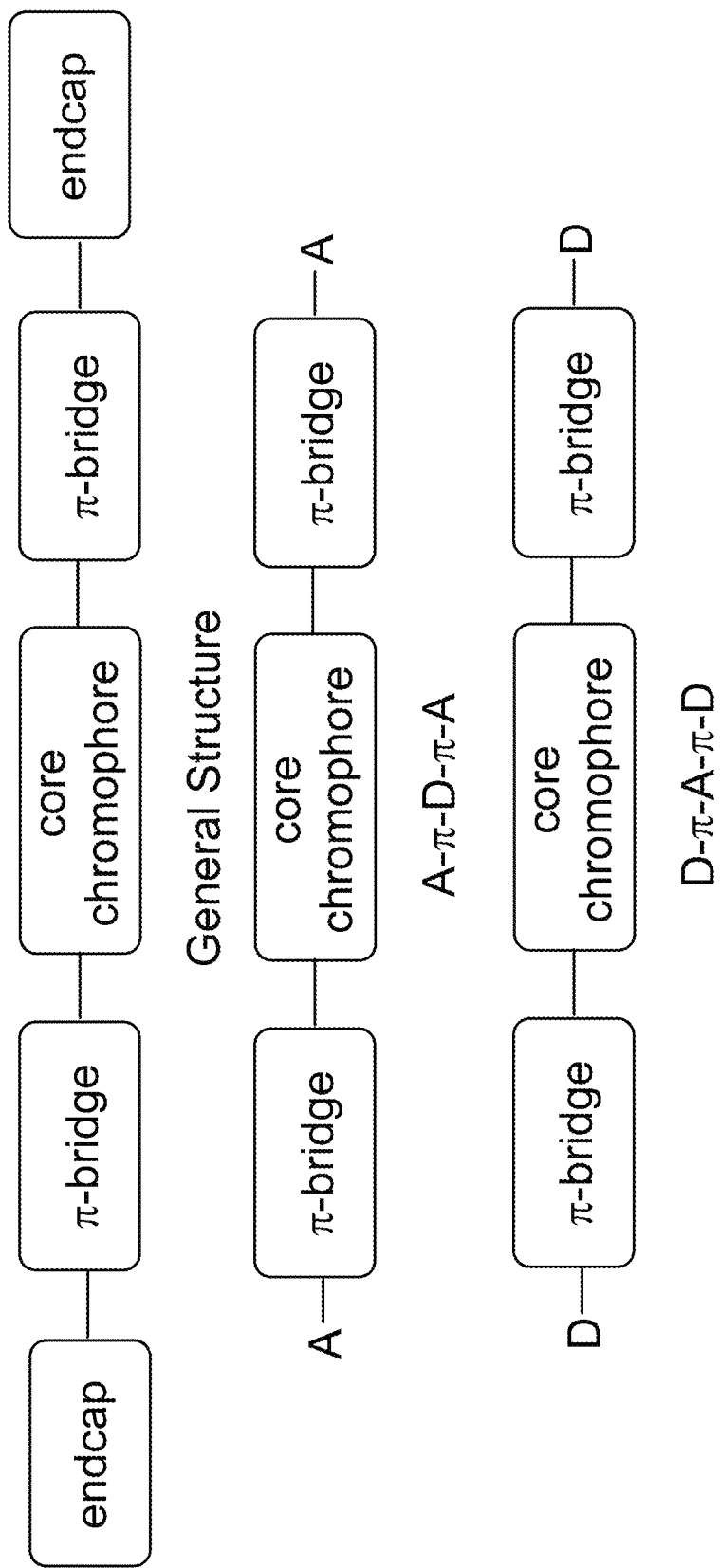
FIG. 11 shows a general schematic showing the A-D-A motif, D-A-D motif, A-π-D-π-A motif, and D-π-A-π-D motif.

FIGS. 10-12 illustrate examples of A-π-D-π-A and D-π-A-π-D materials for OPVs. FIG. 11 shows the simplest schematic. FIG. 12 shows specific π-bridges. The endcaps-π-bridge group are placed in matching pairs, symmetrically on either side of the core chromophore. An A-π-D-π-A or D-π-A-π-D molecule can have one, two or three pairs of the endcaps-π-bridge groups. These pairs can be the same or different, but the two endcaps-π-bridge moieties within a pair must be the same. Additionally, a larger π-bridge can also be constructed from the combination of several smaller π-bridges units shown in FIG. 12, whether similar or dissimilar.

Metal Complexes as Non-Fullerene Acceptors

The A-D-A and D-A-D materials described above assemble electron accepting groups around a central donor. Metal complexes may also be used to assemble A-D-A materials. Building A-D-A acceptors around a metal core brings in a feature of fullerenes that the non-fullerene acceptors do not generally exploit. An important property of fullerenes is their near spherical π-system. This leads to extensive π-π interactions between adjacent fullerenes in 3-dimensions, and is tied to the high electron mobilities in fullerene thin films. Most of the A-D-A acceptors are planar or nearly planar molecules, which π-stack to form extended networks, but these are principally in 1-dimension, not three. Described herein is the use of metal complexes with multidentate ligands to assemble these materials. Extensive π-π stacking interactions are present between ligands of adjacent metal complexes in thin films. FIG. 13 illustrates the orthogonal π-stacking possible with a tetrahedra 1 metal complex (Zn(bDIP)$_2$). The π-stacking in a direction perpendicular to the page is in red, π-stacking in a vertical direction is in blue. A similar packing motif is possible for octahedral complexes coordinated with two planar tridentate ligands. Electron transfer between ligands within a single metal complex is fast due to the close proximity of the ligands, homoconjugation through the metal and intramolecular π-π interaction between ligands. Thus rapid intramolecular electron transfer and multidimensional π-stacking gives rise to rapid and effective electron/hole conduction in the solid state.

The closest analogs to the organic materials described above will have the metal ion stabilizing an organic donor group, such as the pyrrole group of the tridentate ligand illustrated in FIG. 14. In this case the metal ion is relatively innocent in the A-D-A network, acting only to stabilize the anionic pyrrolic donor group. An example of such a compound is shown in FIG. 14, with the HO and LU orbitals shown in yellow and blue, respectively. In this case the acceptor is a triazine group, the metal is Zn and the second ligand is acetylacetonate. The frontier orbitals are localized on the A-D-A ligand; the HO and LU overlap at the pyridyl N and meso-carbons. The molecular orbital distribution in this complex is similar to A-D-A acceptors, with the HO in the center and LU on the periphery, with only a small degree of overlap between the two. TD-DFT calculations of this complex predict a HO-LU transition to absorb in the range of 600 nm with a sizable oscillator strength of 0.19. We can readily alter the energy of the CT excited state and electron conducting orbitals by changing the acceptor group (e.g. FIG. 4) and the Lewis acidity of the metal ion. While this example has a single A-D-A ligand, we will also explore bis-chelated complexes that give rise to octahedral coordination at the metal center, e.g. FIG. 13B.

The ground and excited state properties of the zinc-based materials described above are dominated by the organic ligands, with the role of the metal ion largely to stabilize the complexes' structure and the anionic charge of the ligands. Metal complexes with A-D-A ligands where the metal is not "redox innocent" but instead could itself serve as the donor. For example, if Zn$^{2+}$ of the example given in FIG. 14 is replaced with Sn$^{2+}$ the metal ion becomes the site of hole localization in the CT excited state, forming a trivalent Sn ion at the core. A similar approach is used with the d$^{10}$ ion Cu$^{+}$, or divalent second or third row transition metals, such as Rh$^{2+}$ or Os$^{2+}$, where the ligand field states are sufficiently high in energy that they will not deactivate the excited state of the complex. There are two potential pathways for the electron transfer process in a redox active metal complex of an A-D-A ligand to take place. The metal can engage in an MLCT transition, directly forming an excited state that involves an oxidized metal center and reduced acceptor groups. Alternatively, the complex may absorb light and form an excited A-D-A ligand, followed by metal ion oxidation.

Use of Bodipy Dyes as a Chromophoric Core

Figure 15:
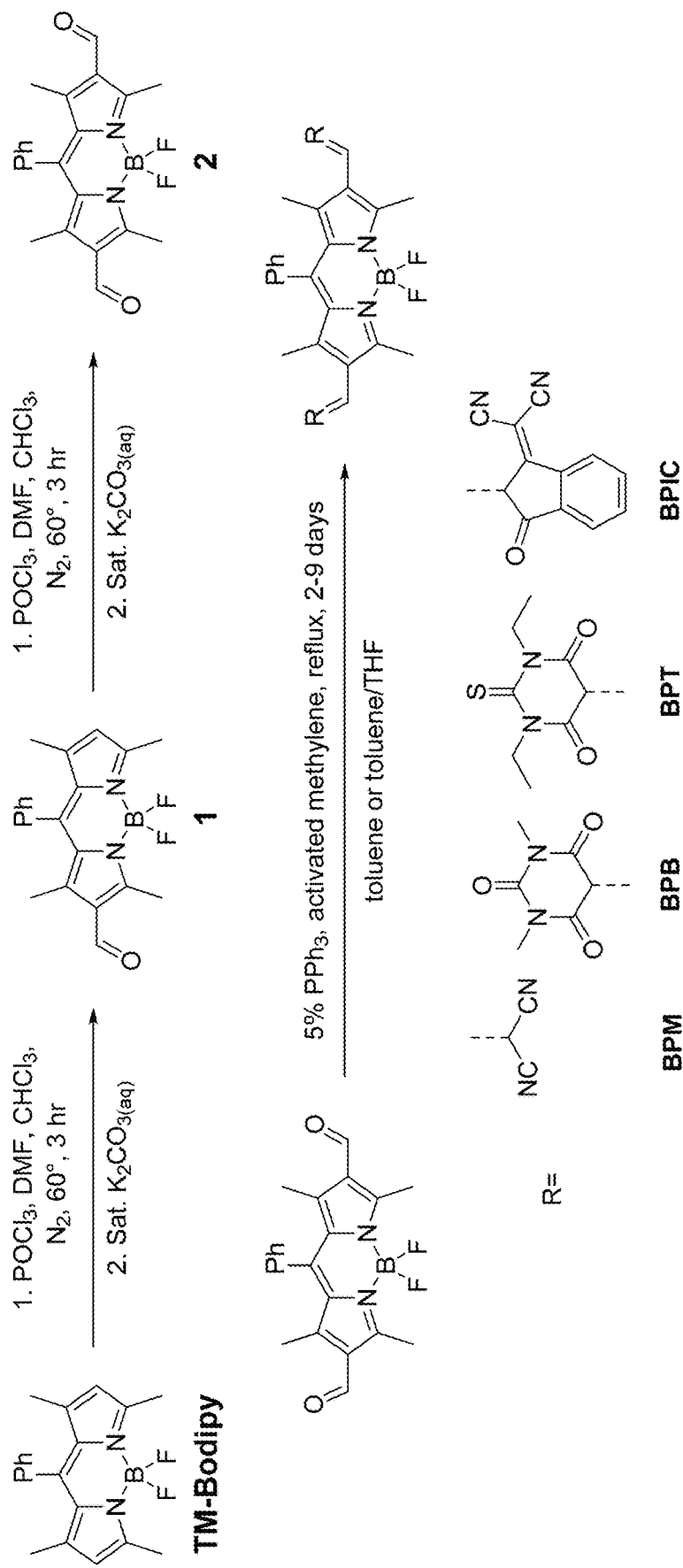
FIG. 15 shows the general synthetic scheme of BPM, BPB, BPT.

Described herein is 1,3,5,7-tetramethyl-8-phenyl-4,4-difluoroboradiazaindacene (TM-bodipy) for use as a simplified donor core. TM-bodipy was used to synthesize 2 novel A-D-A molecules for application as electron acceptors in OPVs: BPM, BPB, and BPT (FIG. 15).

Figure 19:
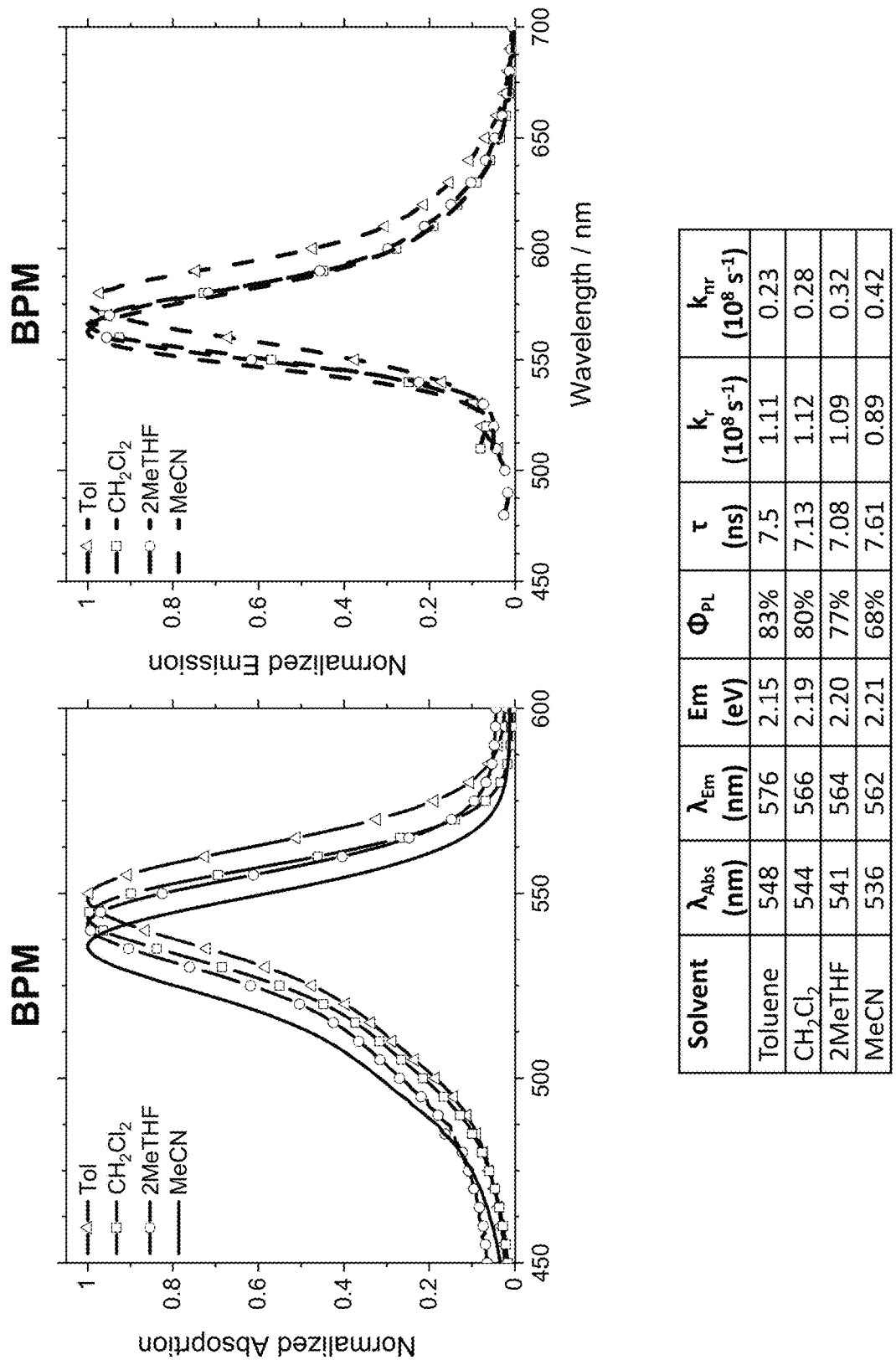
FIG. 19 shows the UV-Vis (solid) and fluorescence emission (dotted) spectra of BPM in various solvents.
Figure 21:
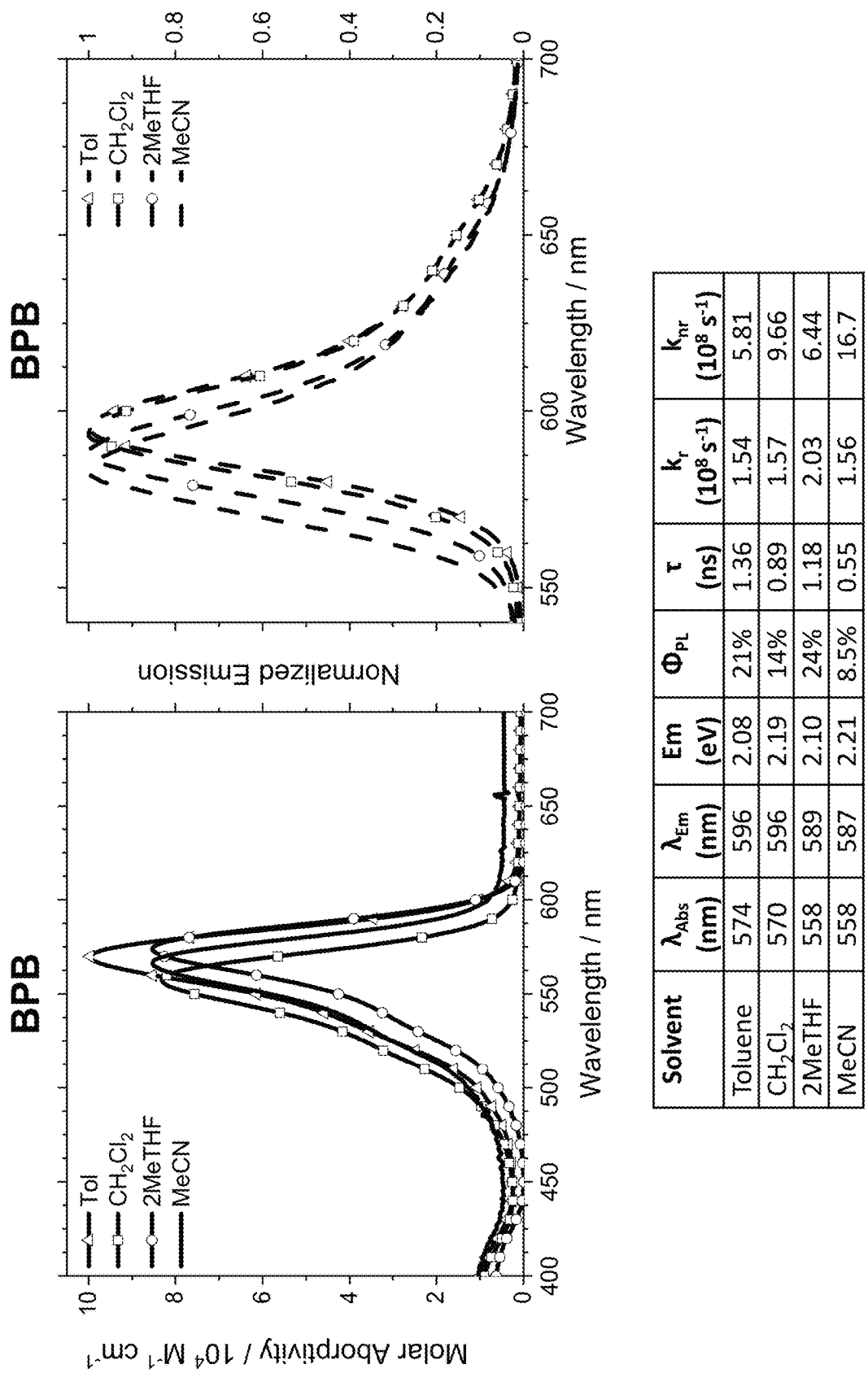
FIG. 21 shows UV-Vis (solid) and fluorescence emission (dotted) spectra of BPB in various solvents.
Figure 23:
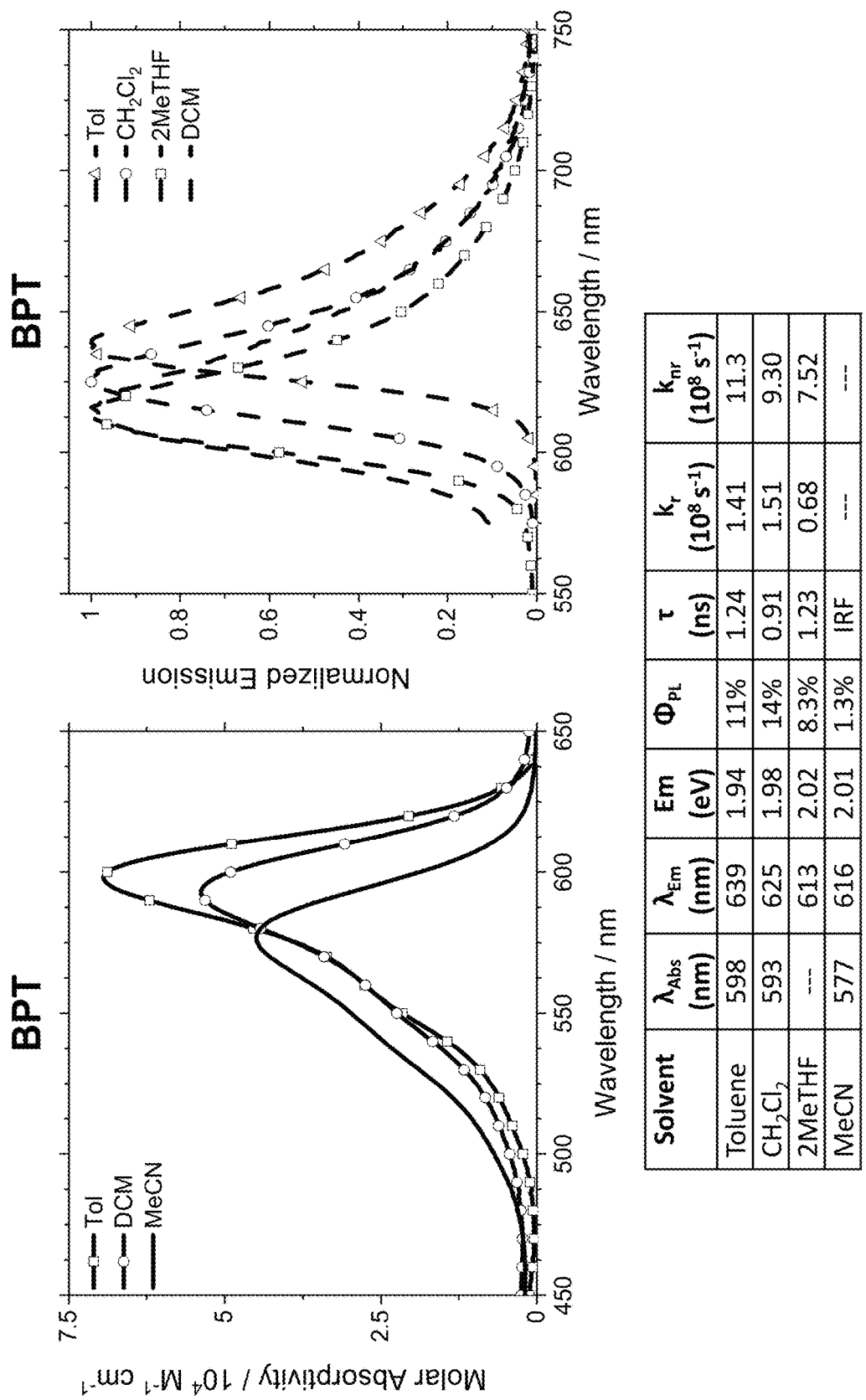
FIG. 23 shows UV-Vis (solid) and fluorescence emission (dotted) spectra of BPT in various solvents.
Figure 24:
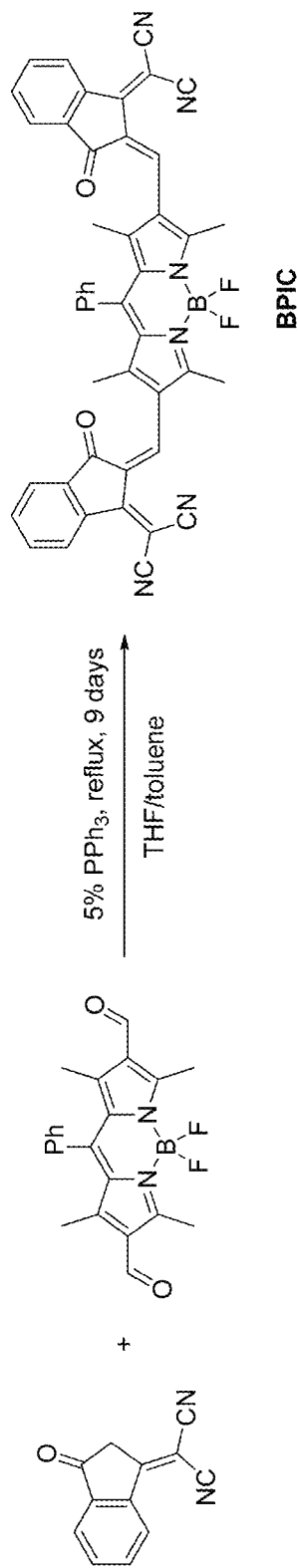
FIG. 24 shows the synthesis of BPIC.
Figure 25:
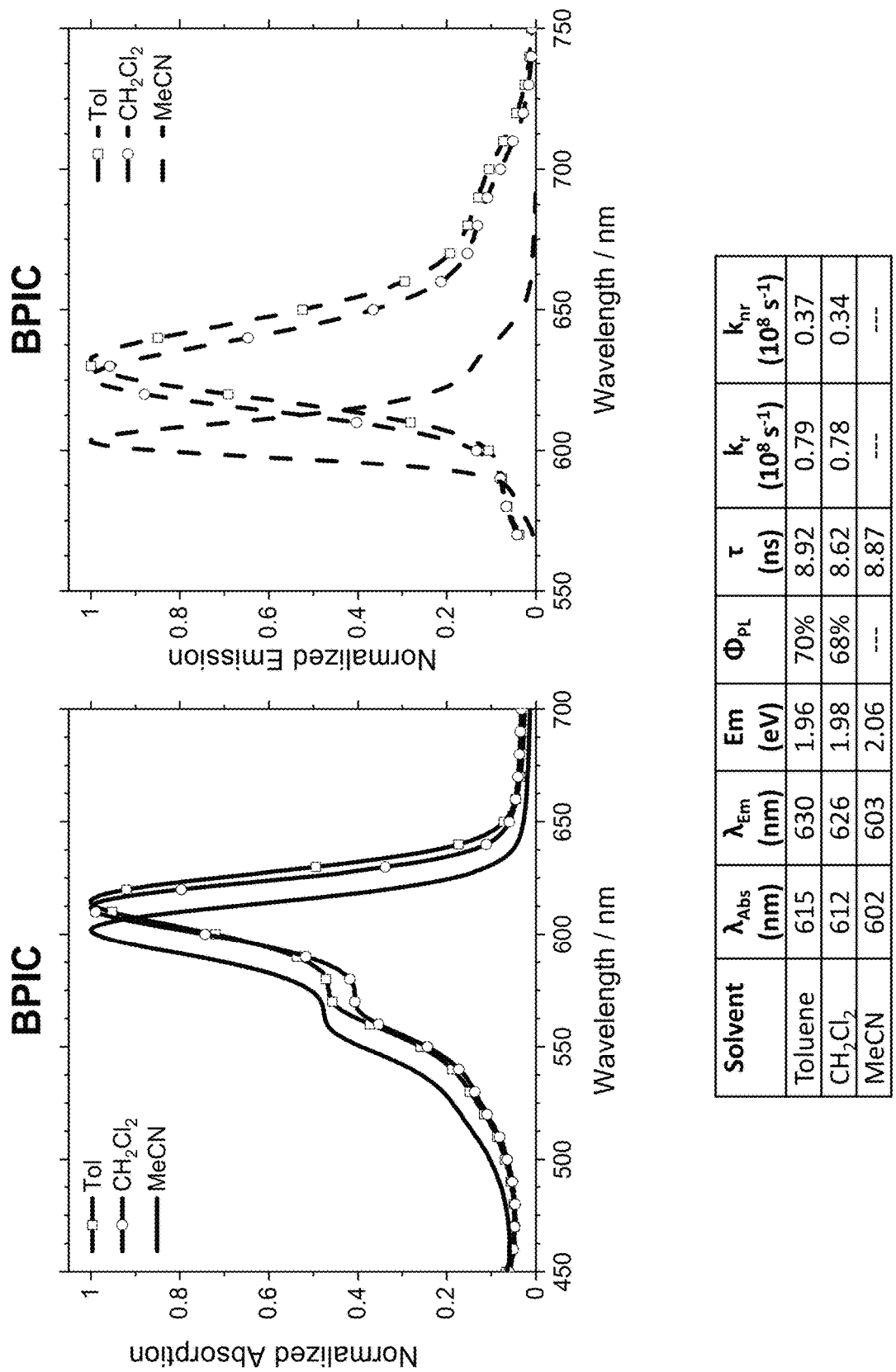
FIG. 25 shows UV-Vis (solid) and fluorescence emission (dotted) spectra of BPIC in various solvents.
Figure 26:
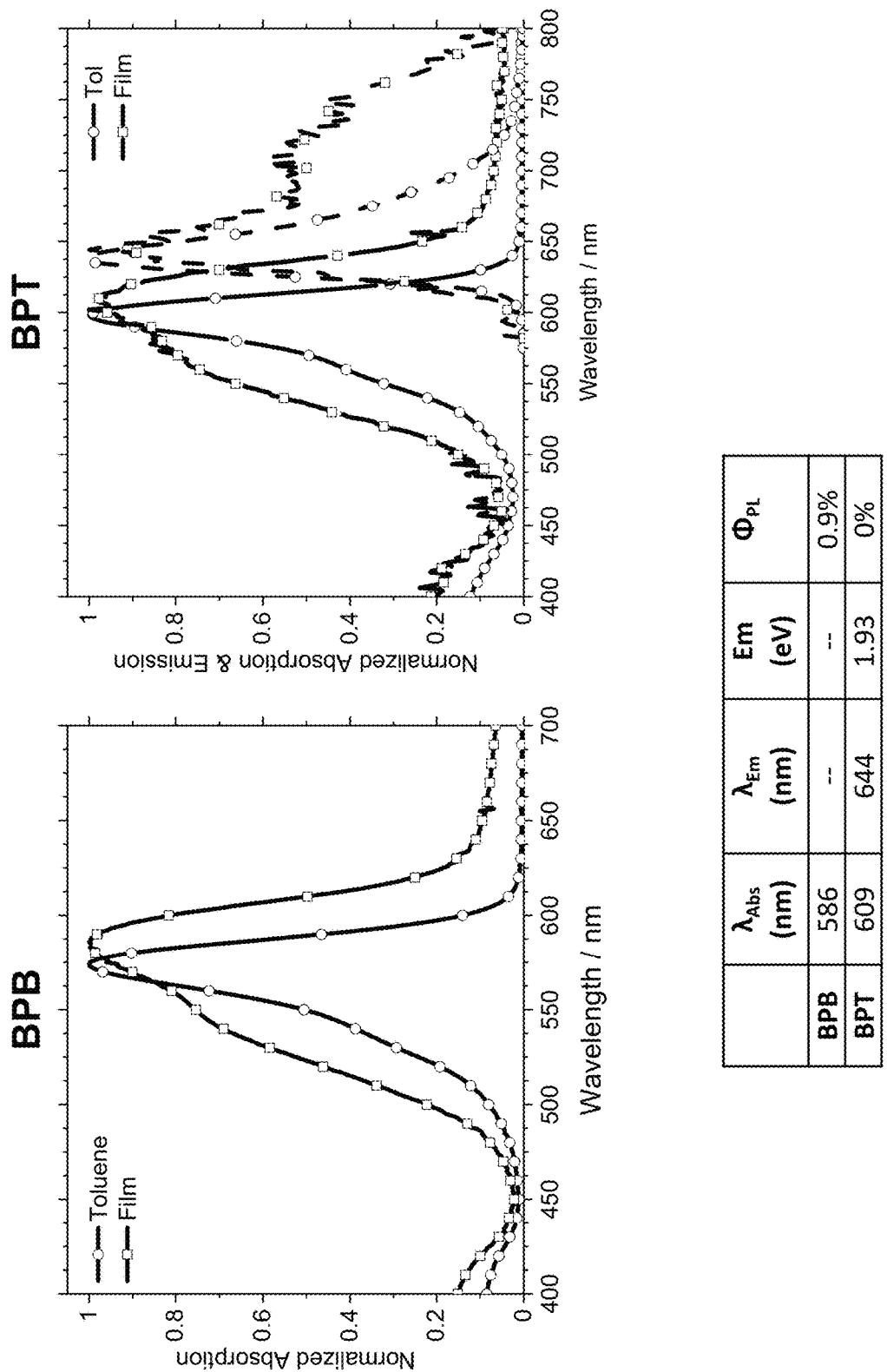
FIG. 26 shows absorption (solid) and emission (dashed) spectra for BPB and BPT in toluene and as spin coated thin films.

These materials absorb between 550 and 650 nm with large extinction coefficients (>10$^4$ M$^{-1}$ cm$^{-1}$). BPM, BPB and BPT feature negative solvatochromism in absorption and in emission while also displaying decreasing lifetime and photoluminescent quantum yields (FIGS. 19, 21, and 23) indicative of the formation of a CT state upon excitation. Spin coated films of BPB and BPT show broaden absorption profiles, demonstrating increased ability to capture the solar spectrum in devices (FIG. 26).

Figure 27:
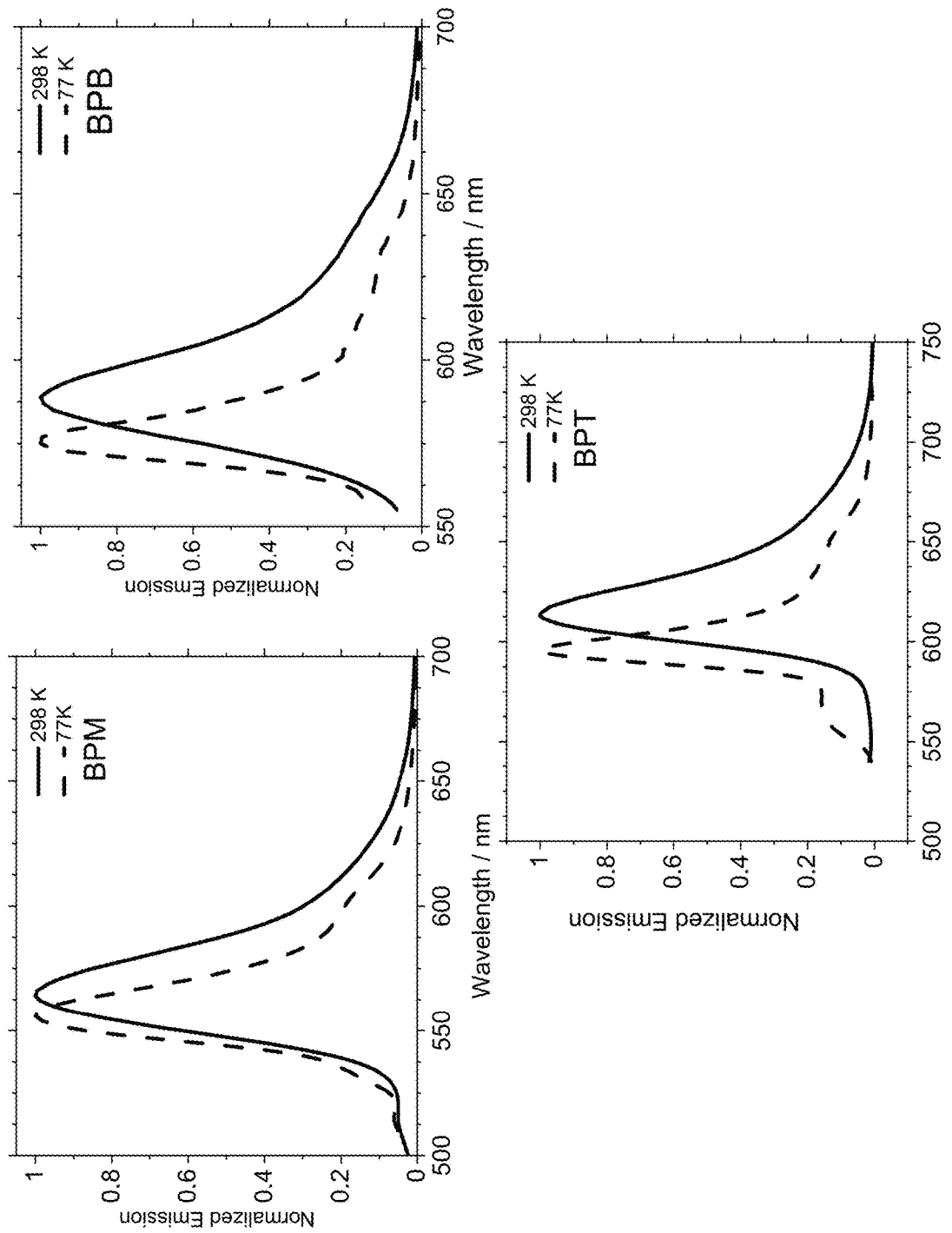
FIG. 27 shows emission spectra at room 298 K (solid) and 77 K (dashed) for BPM, BPB, and BPT in 2-methyltetrahydrofuran.

BPM, BPB, and BPT feature rigidochromic blue shifts in emission upon freezing in a 2-methyltetrahydrofuran glass at 77 K (FIGS. 27 and 28). In a frozen matrix, the non-radiative rate of excited decay decreases by a factor of 4 in BPB and BPT owing either to a reduction is structural distortion in the solid matrix or prevention of formation of the CT state due to the inability for solvent to reorganize around the molecule, both indicative of formation of a CT state upon excitation at room temperature.

Total Synthesis of BPM, BPB, BPD, and BPIC

Synthesis of 1 (FIG. 16): 5,5-difluoro-1,3,7,9-tetramethyl-10-phenyl-5H-514,614-dipyrrolo[1,2-c:2',1'-f][1,3,2]diazaborinine-2-carbaldehyde (1) was synthesized from combined synthetic methods.

Phosphoryl chloride (7 mL, 11.48 g, 74.87 mmol, 40 equiv.) and N,N-dimethylformamide (7 mL, 6.6 g, 90.401 mmol, 49 equiv.) were added to a round bottom flask under $N_2$ and cooled to 0° C. 1 (0.841 g, 2.39 mmol), was dissolved in 50 mL chloroform under $N_2$ and cannula transferred to this flask.

The reaction was heated to 60° C. and left to stir for 5 hr. The reaction was cooled to room temperature, quenched with an aqueous solution of saturated $K_2CO_3$ (100 mL) and extracted with DCM (3×100 mL). The organic layer was then washed with brine (3×100 mL) and with DI water (100 mL) The organic layer was dried with $MgSO_4$ and evaporated in vacuo, yielding 2 as a red solid (0.518 g, 70.4% yield). The product was used without any further purification. 1H NMR (400 MHz, Chloroform-d) δ 10.06 (s, 2H), 7.62-7.56 (m, 3H), 7.30 (dd, J=6.8, 2.9 Hz, 2H), 2.88 (s, 6H), 1.71 (s, 6H).

Synthesis of 2 (FIG. 17): 5,5-difluoro-1,3,7,9-tetramethyl-10-phenyl-5H-414,514-dipyrrolo[1,2-c:2',1'-f][1,3,2]diazaborinine-2,8-dicarbaldehyde (2) was synthesized following a modified synthetic route for 1.

Phosphoryl chloride (9 mL, 14.76 g, 96.27 mmol, 40 equiv.) and N,N-dimethylformamide (9 mL, 8.5 g, 116.23 mmol, 49 equiv.) were added to a round bottom flask under $N_2$ and cooled to 0° C. 1 (0.841 g, 2.39 mmol), was dissolved in 50 mL chloroform under $N_2$ and cannula transferred to this flask.

The reaction was heated to 60° C. and left to stir for 3 hr. The reaction was cooled to room temperature, quenched with an aqueous solution of saturated $K_2CO_3$ (100 mL) and extracted with DCM (3×100 mL). The organic layer was then washed with brine (3×100 mL) and with DI water (100 mL) The organic layer was dried with $MgSO_4$ and evaporated in vacuo, yielding 2 as a red solid (0.490 g, 54.0% yield). The product was used without any further purification. 1H NMR (400 MHz, Chloroform-d) δ 10.06 (s, 2H), 7.62-7.56 (m, 3H), 7.30 (dd, J=6.8, 2.9 Hz, 2H), 2.88 (s, 6H), 1.71 (s, 6H).

Figure 18:
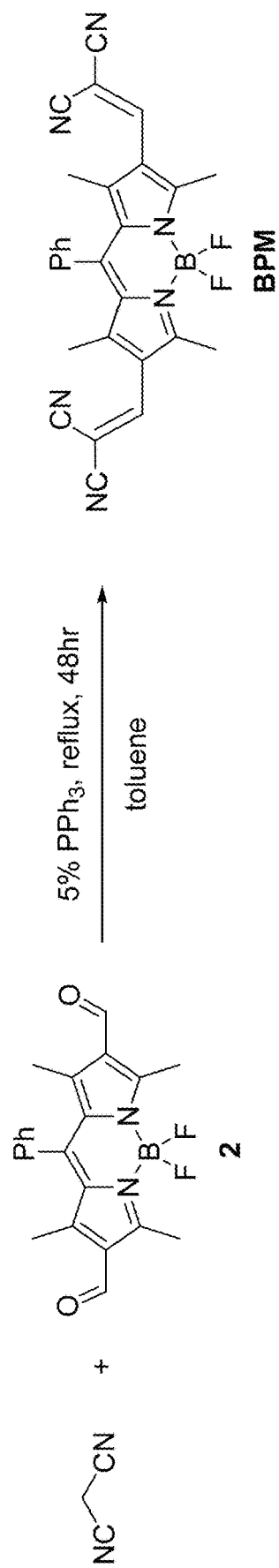
FIG. 18 shows the synthesis of BPM.

Synthesis of BPM (FIG. 18): 2,2'-((5,5-difluoro-1,3,7,9-tetramethyl-10-phenyl5H-414,514-dipyrrolo[1,2-c:2',1'-f][1,3,2]diazaborinine-2,8-diyl)bis(methaneylylidene))dimalononitrile (BPM) was synthesized following a modified literature procedure. 2 (100 mg, 283.13 μmol), malononitrile (130.70 mg, 1.33 mmol, 5 equiv.) triphenylphosphine (5.32 mg, 20.28 μM, 0.05 equiv.) and 50 mL dry toluene were added to a round bottom flask with a stir bar. The reaction was heated to 110° C. and left to reflux for 48 hr. The reaction was allowed to cool and washed with a saturated $K_2CO_3$(aq) (3×100 mL). The organic layer was dried with $MgSO_4$ and evaporated in vacuo. The crude product was recrystallized through vapor diffusion of hexane into CH2Cl2 yielding BPM as a green metallic solid (0.0142 g, 13.0% yield.) $^1$H NMR (400 MHz, cdcl$_3$) δ 7.68 (s, 2H), 7.63-7.58 (m, 3H), 7.29 (s, 2H), 2.68 (s, 6H), 1.49 (s, 6H).

Synthesis of BPB (FIG. 20): 2,2'-((5,5-difluoro-1,3,7,9-tetramethyl-10-phenyl-5H-414,514-dipyrrolo[1,2-c:2',1'-f][1,3,2]diazaborinine-2,8-diyl)bis(methaneylylidene))dimalononitrile (BPB) was synthesized following a modified literature procedure. 2 (149.67 mg, 393.66 μM), 1,3-diethyl-2-thio-barbituic acid (309.54 mg, 1.98 mM, 5 equiv.) triphenylphosphine (5.18 mg, 19.75 μM, 0.05 equiv.) and 50 mL dry toluene were added to a round bottom flask with a stir bar under $N_2$. The reaction was heated to 110° C. and left to reflux for 48 hr. The reaction was allowed to cool and washed with a saturated $K_2CO_{3(aq)}$ (3×100 mL). The organic layer was dried with $MgSO_4$ and evaporated in vacuo. The crude product was recrystallized through vapor diffusion of hexane into $CH_2Cl_2$ yielding BPB as a matte brown solid (183.20 mg, 70.89% yield). 1H NMR (400 MHz, Chloroform-d) δ 8.33 (s, 2H), 7.57-7.53 (m, 3H), 7.36 (dd, J=7.5, 2.1 Hz, 2H), 3.40 (s, 6H), 3.33 (s, 6H), 2.55 (s, 6H), 1.36 (s, 6H).

Synthesis of BPT (FIG. 22): 2,2'-((5,5-difluoro-1,3,7,9-tetramethyl-10-phenyl-5H-414,514-dipyrrolo[1,2-c:2',1'-f][1,3,2]diazaborinine-2,8-diyl)bis(methaneylylidene))dimalononitrile (BPT) was synthesized following a modified literature procedure. 3 (99.81 mg, 261.5 μM), 1,3-diethyl-2-thio-barbituic acid (263.88 mg, 1.32 mM, 5 equiv.) triphenylphosphine (3.59 mg, 13.69 μM, 0.05 equiv.) and 50 mL dry toluene were added to a round bottom flask with a stir bar under $N_2$. The reaction was heated to 110° C. and left to reflux for 48 hr. The reaction was allowed to cool and washed with a saturated $K_2CO_{3(aq)}$ (3×100 mL). The organic layer was dried with $MgSO_4$ and evaporated in vacuo. The crude product was recrystallized through vapor diffusion of hexane into $CH_2Cl_2$ yielding BPT as a matte green solid (109.4 mg, 56.0% yield). 1H NMR (400 MHz, Chloroform-d) δ 8.33 (s, 2H), 7.57-7.53 (m, 3H), 7.36 (dd, J=7.5, 2.1 Hz, 2H), 3.40 (s, 6H), 3.33 (s, 6H), 2.55 (s, 6H), 1.36 (s, 6H).

Device Fabrication and Characterization Using BPT

Figure 29:
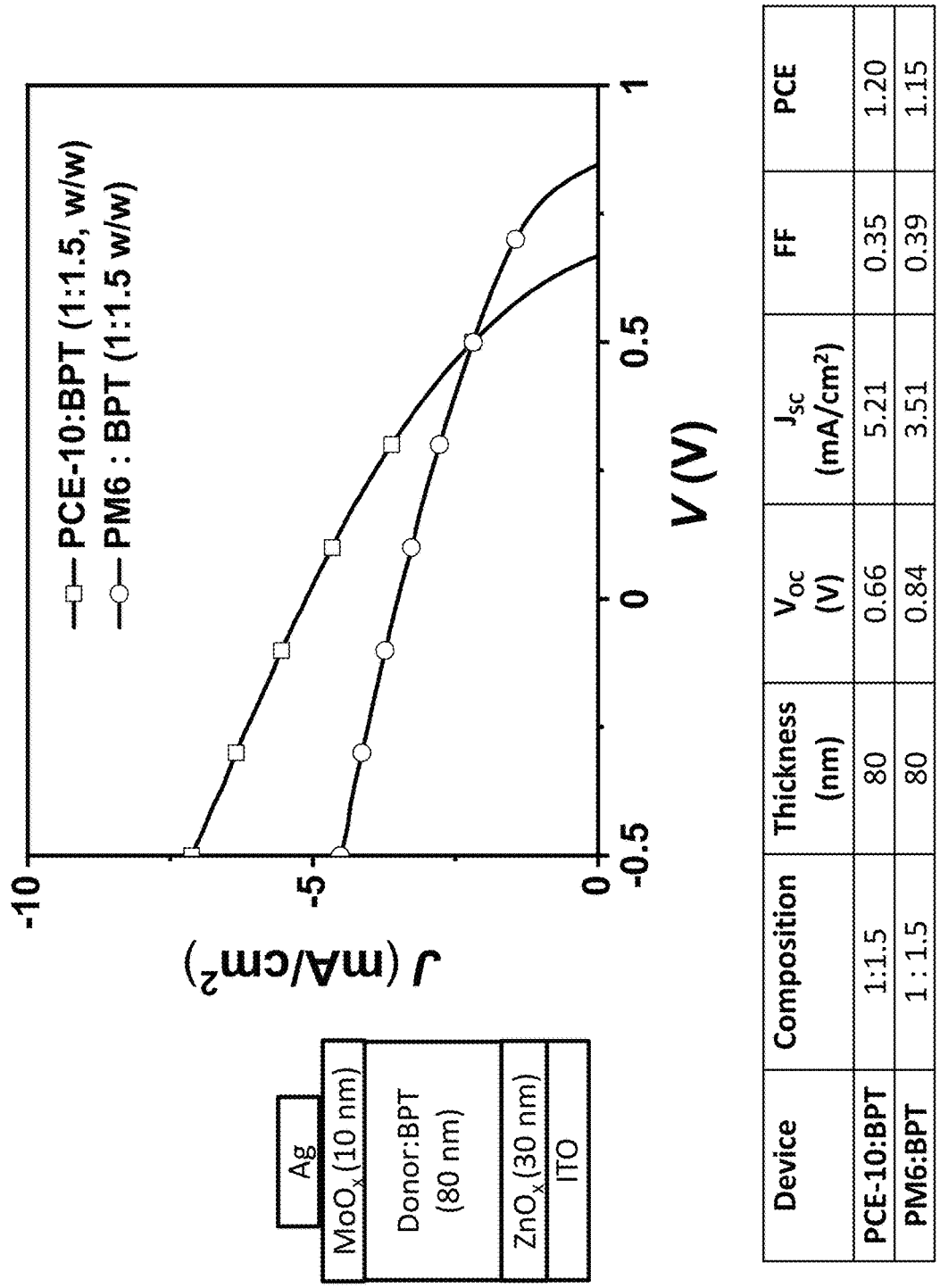
FIG. 29 shows device parameters for BHJ devices fabricated from PCE-10:BPT (square) and PM6:BPT (circle).

Two BHJ solar cells were fabricated with the following structure: glass/indium-tin-oxide/ZnOx (30 nm)/D:A 1:1.5 (w/w) BHJ (80 nm)/MoO$_x$ (10 nm)/Ag where BPT was used as the acceptor and the donors were PCE-10 and PM6. These devices displayed $J_{SC}$ between 3.5 and 5.2 mA/cm$^2$, $V_{OC}$ between 0.66 and 0.84 V, fill factors of 0.35 and 0.39, and PCE of 1.15-1.20% (FIG. 29).

Synthesis of BPIC (FIG. 22): 2,2'-((2Z,2'Z)-((5,5-difluoro-1,3,7,9-tetramethyl-10-phenyl-5H-414,514-dipyrrolo[1,2-c:2',1'-f] [1,3,2]diazaborinine-2,8-diyl)bis(methaneylylidene))bis(3-oxo-2,3-dihydro-1H-indene-2,1-diylidene)) dimalononitrile (BPIC) was synthesized following a modified literature procedure. 3 (99.81 mg, 261.5 μM), 2-(3-oxo-2,3-dihydro-1H-inden-1-ylidene)malononitrile (230.59 mg, 1.19 mmol, 3 equiv.) triphenylphosphine (8.14 mg, 31.03 μM, 0.08 equiv.) and 30 mL dry THF and 25 ml toluene were added to a round bottom flask with a stir bar under $N_2$. The reaction was heated to 110° C. and left to boil for 96 hr to drive off THF. Then 25 mL of toluene was added and the reaction was allowed to reflux for 48 hrs. Then a second portion of 2-(3-oxo-2,3-dihydro-1H-inden-1-ylidene)malononitrile (230.59 mg, 1.17 mmol, 2.96 equiv.) was added. The reaction was allowed to reflux another 48 hrs until traces of the starting material and monosubstituted precursor were not visible by UV-Vis spectroscopy. The reaction was allowed to cool and washed with a saturated $K_2CO_{3(aq)}$ (3×100 mL). The majority of the product was lost to the aqueous phase. The organic phase was evaporated in vacuo to produce a thin blue film. The blue film was shown to be pure by NMR and used to produce normalized absorption spectra in various solvents.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound represented by Formula (A-I):

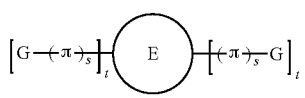
(A)

wherein

E is a core chromophore group represented by Formula (E-1);

A is an electron accepting group represented by a formula selected from the group consisting of Formula (A-4) to Formula (A-9):

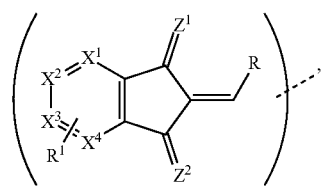
(A-4)

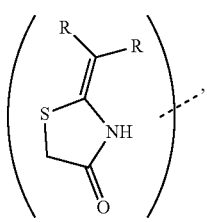
(A-5)

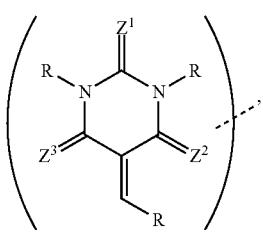
(A-6)

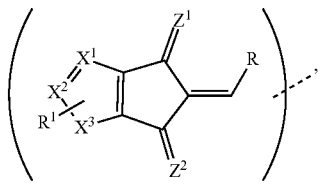
(A-7)

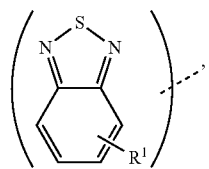
(A-8)

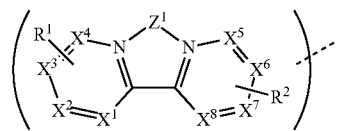
(A-9)

wherein, in Formula (A-4) to Formula (A-9), each $R^1$ to $R^2$ independently represents mono to the maximum allowable substitution;

each R and $R^1$ to $R^2$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;

each $X^1$ to $X^8$ independently represents C, Si, N or P; and each $Z^1$, $Z^2$, and $Z^3$ independently represents $CR_2$, NR, O, or S;

π is a linking group;

m is an integer from 0 to 3; and p is an integer from 1 to 3;

wherein each A is the same and each π is the same

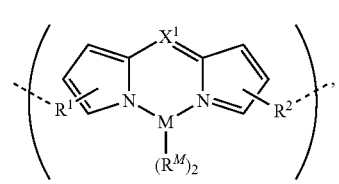
(E-1)

wherein, in Formula (E-1):

each $R^1$ and $R^2$ independently represents mono to the maximum allowable substitution;

each $R^1$ and $R^2$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent $R^1$ or $R^2$ are optionally joined or fused together to form a ring which is optionally substituted each $R^M$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

$X^1$ represents C, Si, N or P; and

M is a monovalent, divalent, trivalent or tetravalent atom.

2. The compound of claim 1, wherein M is selected from the group consisting of B, Al, C, Si, Ge, Ti, Zr, Hf, Zn, Cd, Ca, Cu, Ag and Au; or wherein each $R^M$ independently represents hydrogen or a substituent selected from the group consisting of halogen, pseudohalogen, alkyl, alkenyl, alkynyl, aryl, alkoxy, hydroxyl, and combinations thereof.

3. The compound of claim 1, wherein A is a group represented by Formula (A-6) or (A-7)

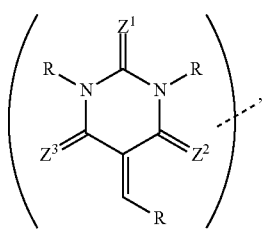

(A-6)

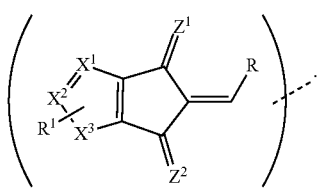

(A-7)

4. The compound of claim 1, wherein x is a group represented by a formula selected from the group consisting of Formula (P-1) to Formula (P-11):

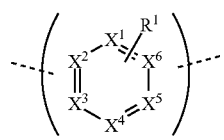

(P-1)

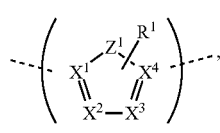

(P-2)

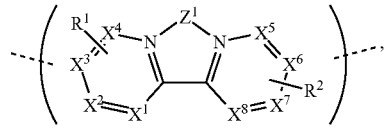

(P-3)

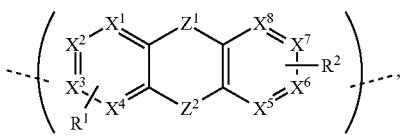

(P-4)

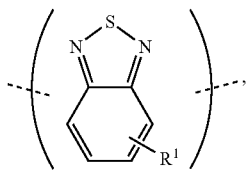

(P-5)

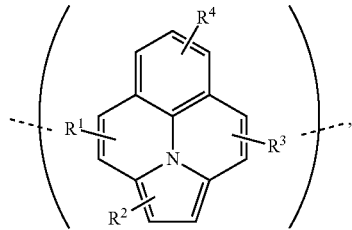

(P-6)

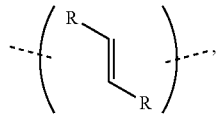

(P-7)

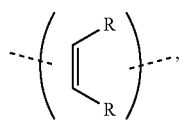

(P-8)

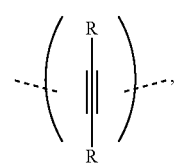

(P-9)

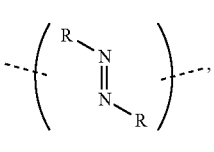

(P-10)

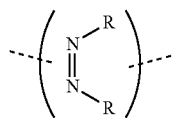

(P-11)

each $R^1$ to $R^4$ independently represents mono to the maximum allowable substitution;

each R and $R^1$ to $R^2$ independently represents hydrogen or a substituent selected from the group consisting of deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitrile, isonitrile, sulfanyl, boryl, acyl, carboxylic acid, benzoyl, ether, ester, vinyl, ketone, sulfinyl, sulfonyl, cyano, phosphino and combinations thereof;

wherein any two adjacent R or $R^1$ to $R^4$ are optionally joined or fused together to form a ring which is optionally substituted;

each $X^1$ to $X^8$ independently represents C, Si, N or P; and
each $Z^1$ and $Z^2$ independently represents $CR_2$, NR, O, or S.

5. The compound of claim 1, wherein A is selected from the group consisting of

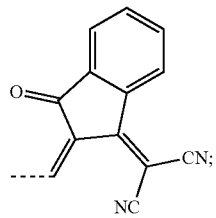

and E is

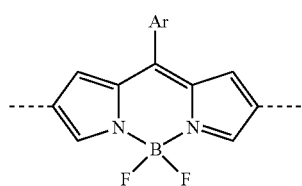

wherein Ar is an aryl group.

6. The compound of claim 1, wherein the compound is selected from the group consisting of:

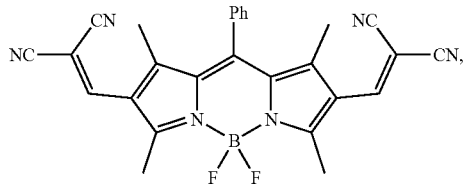

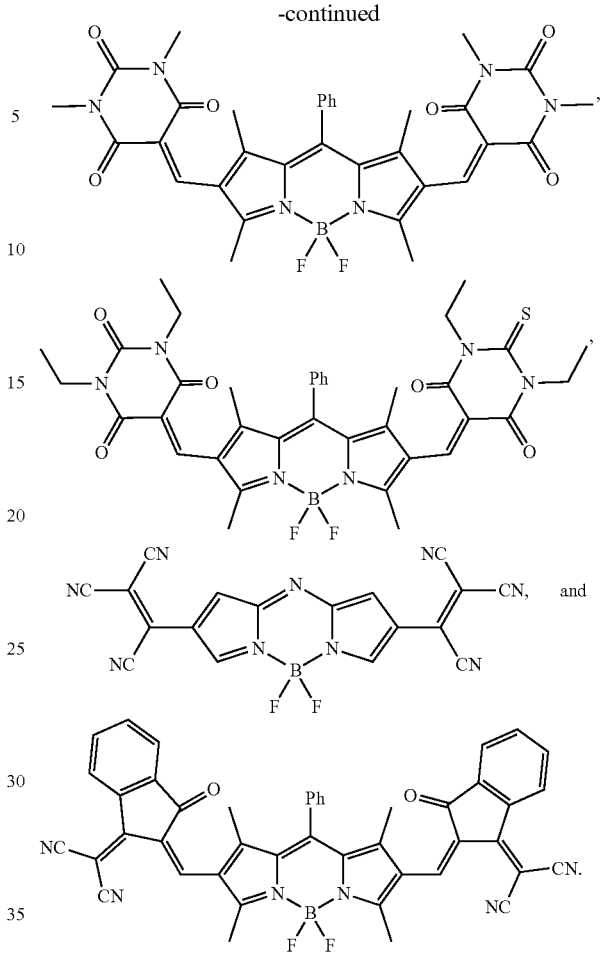

7. An organic photovoltaic device comprising:
   an anode;
   a cathode; and
   an organic layer, disposed between the anode and the cathode, comprising a compound according to claim 2.

8. A formulation comprising the compound of claim 1.

* * * * *